(12) United States Patent
Jevtic

(10) Patent No.: US 6,336,204 B1
(45) Date of Patent: Jan. 1, 2002

(54) METHOD AND APPARATUS FOR HANDLING DEADLOCKS IN MULTIPLE CHAMBER CLUSTER TOOLS

(75) Inventor: Dusan Jevtic, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/074,122

(22) Filed: May 7, 1998

(51) Int. Cl.[7] ............................ G06F 17/50; G06F 19/00; G06F 7/00; B65G 49/07
(52) U.S. Cl. .................. 716/1; 700/97; 700/100; 700/101; 700/102; 700/103; 700/121; 700/213; 700/120; 414/936; 414/937; 414/939; 414/940; 414/941
(58) Field of Search .................. 716/1; 700/121, 700/120, 96

(56) References Cited

U.S. PATENT DOCUMENTS

| | | | | |
|---|---|---|---|---|
| 5,928,389 A | * | 7/1999 | Jevtic | 29/25.01 |
| 5,975,740 A | * | 11/1999 | Lin et al. | 364/468.05 |
| 5,980,591 A | * | 11/1999 | Akimoto et al. | 29/25.01 |
| 6,074,443 A | * | 6/2000 | Venkatesh et al. | 29/25.01 |
| 6,122,566 A | * | 9/2000 | Nguyen et al. | 700/218 |
| 6,201,998 B1 | * | 3/2001 | Lin et al. | 700/97 |

OTHER PUBLICATIONS

M. Krishnamurthi et al., Deadlock Detection and Resolution in Simulation Models, Proceedings of the 1994 Conference on Winter Simulation, pp. 708–715, Dec. 1994.*

D.A. Bodner et al., Virtual Factories: An Object–oriented Simulation–based Framework for Real–time FMS Control, 1997 6th International Conference on Emerging Technologies and Factory Automation Proceedings, pp. 208–213, Sep. 1997.*

* cited by examiner

Primary Examiner—Matthew Smith
Assistant Examiner—A. M. Thompson
(74) Attorney, Agent, or Firm—Thomason, Moser & Patterson

(57) ABSTRACT

A method and apparatus for handling deadlocks in a multichamber semiconductor wafer processing system known as a cluster tool. A plurality of software routines execute upon a sequencer of a cluster tool to perform deadlock avoidance, deadlock detection and deadlock resolution towards achieving optimal wafer throughput for a cluster tool.

39 Claims, 10 Drawing Sheets

FIG. 2B circular wait

METHOD AND APPARATUS FOR HANDLING DEADLOCKS IN MULTIPLE CHAMBER CLUSTER TOOLS

BACKGROUND OF THE DISCLOSURE

1. Field of the Invention

The invention generally relates to semiconductor wafer processing systems. More particularly, the invention relates to a method and apparatus for handling deadlocks in a multiple chamber semiconductor processing system.

2. Description of the Background Art

Semiconductor wafers are processed to produce integrated circuits using a plurality of sequential process steps. These steps are performed using a plurality of process chambers. An assemblage of process chambers served by a wafer transport robot is known as a multiple chamber semiconductor wafer processing tool or cluster tool.

FIG. 1 depicts a schematic diagram of an illustrative multiple chamber semiconductor wafer processing tool known as the Endura System manufactured by Applied Materials, Inc. of Santa Clara, Calif. Endura is a trademark of Applied Materials, Inc. of Santa Clara, Calif. This tool can be adapted to utilize either single, dual, or multiple blade robots to transfer wafers from chamber to chamber.

The cluster tool 100 contains, for example, four process chambers 104, 106, 108, 110, a transfer chamber 112, a preclean chamber 114, a buffer chamber 116, a wafer-orienter/degas chamber 118, a cooldown chamber 102, and a pair of load lock chambers 120 and 122. Each process chamber represents a different stage or phase of semiconductor wafer processing. The buffer chamber 116 is centrally located with respect to the load lock chambers 120 and 122, the wafer orienter/degas chamber 118, the preclean chamber 114 and the cooldown chamber 102. To effectuate wafer transfer amongst these chambers, the buffer chamber 116 contains a first robotic transfer mechanism 124, e.g., a single blade robot (SBR). The wafers 128 are typically carried from storage to the system in a plastic transport cassette 126 that is placed within one of the load lock chambers 120 or 122. The robotic transport mechanism 124 transports the wafers 128, one at a time, from the cassette 126 to any of the three chambers 118, 102, or 114. Typically, a given wafer is first placed in the wafer orienter/degas chamber 118, then moved to the preclean chamber 114. The cooldown chamber 102 is generally not used until after the wafer is processed within the process chambers 104, 106, 108, 110. Individual wafers are carried upon a wafer transport blade 130 that is located at the distal end of the first robotic mechanism 124. The transport operation is controlled by the sequencer 136.

The sequencer 136 controls the processing and wafer transfer performed by the cluster tool 100. The sequencer 136 contains a microprocessor 138 (CPU), a memory 140 for storing the control routines, and support circuits 142, such as power supplies, clock circuits, cache and the like. The sequencer 136 also contains input/output peripherals 144 such as a keyboard, mouse, and display. The sequencer 136 is a general purpose computer that is programmed to perform the sequencing and scheduling operations that facilitate wafer processing and transport. The software routines that control the cluster tool are stored in memory 140 and executed by the microprocessor 138 to facilitate control of the cluster tool.

It is contemplated that some of the process steps discussed herein as software processes may be implemented within hardware, e.g., as circuitry that cooperates with the microprocessor to perform various process steps. Although the schedule generator is depicted as a general purpose computer that is programmed to perform various scheduling routines, the processes that are implemented by the software can be implemented as hardware as an application specific integrated circuit (ASIC) or discrete circuit components. As such, the process steps described herein are intended to be broadly interpreted as being equivalently performed by software, hardware, or any combination thereof.

The transfer chamber 112 is surrounded by, has access to, the four process chambers 104, 106, 108 and 110, as well as the preclean chamber 114 and the cooldown chamber 102. To effectuate transport of a wafer amongst the chambers, the transfer chamber 112 contains a second robotic transport mechanism 132, e.g., another single blade robot (SBR). The mechanism 132 has a wafer transport blade 134 attached to the distal end of an extendable arm. The blade is used for carrying the individual wafers to and from a chamber.

Once processing is complete within the process chambers, the transport mechanism 132 moves the wafer from the process chamber and transports the wafer to the cooldown chamber 102. The wafer is then removed from the cooldown chamber using the first transport mechanism 124 within the buffer chamber 116. Lastly, the wafer is placed in transport cassette 126 within the load lock chamber 122.

When considering the effects of a deadlock, a system is assumed to consist of a finite number of resources (e.g., CPU, memory, printers, chambers, robots, load locks, and the like) to be distributed among a number of competing entities (e.g., processes, wafers, and the like). The resources are assumed partitioned into several types, each type being comprised of a certain number of identical instances. For example, if a cluster tool has a stage with two parallel etch chambers, then the resource type "etch" has two instances. Thus, if an entity requests some resource type, the allocation of any instance of that type must satisfy the request.

A deadlock situation arises when no further progress can be made due to inadequate scheduling of activities in the system (i.e., a resource misallocation). Let $\{W_1, W_2, \ldots, W_n\}$ be a set of entities (e.g., wafers) operating on a set of resources $\{C_1, C_2, \ldots, C_k\}$ and let $k_i$ be a non-empty subset of $\{C_1, C_2, \ldots, C_k\}$ the entity $W_i$ must acquire in order to finish its task. Then, $W_1, W_2, \ldots, W_n$ are in a "deadlock state" if $K_i$ is held by entities other than $W_i$ for all i. In other words, a set of entities is in a deadlock state when every entity is waiting for an event (e.g., resource release) that can only be caused by another entity from the same set. Consequently, a deadlock problem is a logical one and it happens when members of a group of entities which hold resources are blocked indefinitely from access to resources held by other entities within the group. When no entity in the group will relinquish control over its resources until after it has completed its current resource acquisition, deadlock is inevitable and can be broken only by the involvement of some external agency.

A deadlock in a cluster tool may cause substantial processing delays that could result in wafer damage. Poor handling of a deadlock state in a cluster tool may cause a significant loss of throughput which directly translates into the loss of money for integrated circuit manufacturers.

Therefore, a need exists in the art for a method and apparatus that efficiently handles deadlocks in multiple chamber cluster tool to improve throughput of the tool.

SUMMARY OF THE INVENTION

The present invention is a method and apparatus for handling deadlocks in a multichamber semiconductor wafer processing system known as a cluster tool. The invention is embodied in a plurality of software routines that execute upon a sequencer of a cluster tool. The invention performs deadlock avoidance, deadlock detection and deadlock resolution towards achieving optimal wafer throughput for a cluster tool.

In one embodiment of the invention, the sequencer executes a deadlock avoidance routine that ensures that wafer deadlock never occurs by first identifying a wafer processing loop within the wafer process sequence. A wafer processing loop occurs in a process sequence when a particular chamber in the sequence must be used for two process steps. As such, a wafer progresses through a plurality of chambers and loops back to a chamber (known as a knot chamber) that had already been used. If the loop becomes filled with wafers, the wafer that is about to enter the knot chamber from either within the loop or from outside the loop may have to wait and cluster tool deadlock results. The inventive deadlock avoidance routine avoids the resultant deadlock in a processing loop by never allowing enough wafers to enter the loop to cause a deadlock, i.e., less wafers are in the loop than is the loop's capacity for wafers. In this manner, there are never enough wafers being processed in the loop to produce a deadlock.

In another embodiment of the invention, the sequencer performs deadlock detection by determining when a circular wait occurs within a process sequence, i.e., a wafer must wait for its destination chamber to complete processing a wafer before the wafer can be moved to the destination chamber. The circular wait occurs when there are no chambers in a processing loop that are not either processing a wafer or otherwise unavailable (e.g., executing a clean cycle). If, within a processing loop, there is at least one chamber that is available to accept a new wafer, then a circular wait cannot exist. Once a deadlock situation is determined through identification of a circular wait, the sequencer can notify an operator about the deadlock or an automatic deadlock resolution routine can be executed to resolve the deadlock.

One such deadlock resolution routine that is executed after a circular wait is detected, resolves the deadlock by removing wafer(s) from the processing loop. Wafer removal may be accomplished by removing multiple wafers from the loop or by removing a wafer from a knot chamber within the loop. The removed wafer is placed in a temporary storage location until a target chamber for that wafer is available. When a target chamber is available, the removed wafer is returned to the loop.

To prioritize the movement of wafers to effectively resolve deadlocks as well as schedule wafers for processing, a gamma-tolerant scheduling technique is combined with a deadlock resolution technique. The gamma-tolerant scheduling technique prioritizes chambers and their wafers to effect movement of higher priority wafers before movement of lower priority wafers. The technique also computes the remaining processing time for a primary wafer or chamber and causes the transport robot to move other wafers during that time, then returns the robot to the primary wafer or chamber to effect its move. In this manner, wafer movement inside a processing loop, outside a processing loop and to/from knot chambers can be prioritized to enhance wafer throughput.

Executing one or more of the embodiments of the invention using the sequencer of a cluster tool, can enhance wafer throughput for the cluster tool. In accordance with the invention, deadlock situations can be avoided altogether or detected and quickly resolved.

BRIEF DESCRIPTION OF THE DRAWINGS

The teachings of the present invention can be readily understood by considering the following detailed description in conjunction with the accompanying drawings in which.

To facilitate understanding, identical reference numerals have been used, where possible, to designate identical elements that are common to the figures.

DETAILED DESCRIPTION

Figure 1:
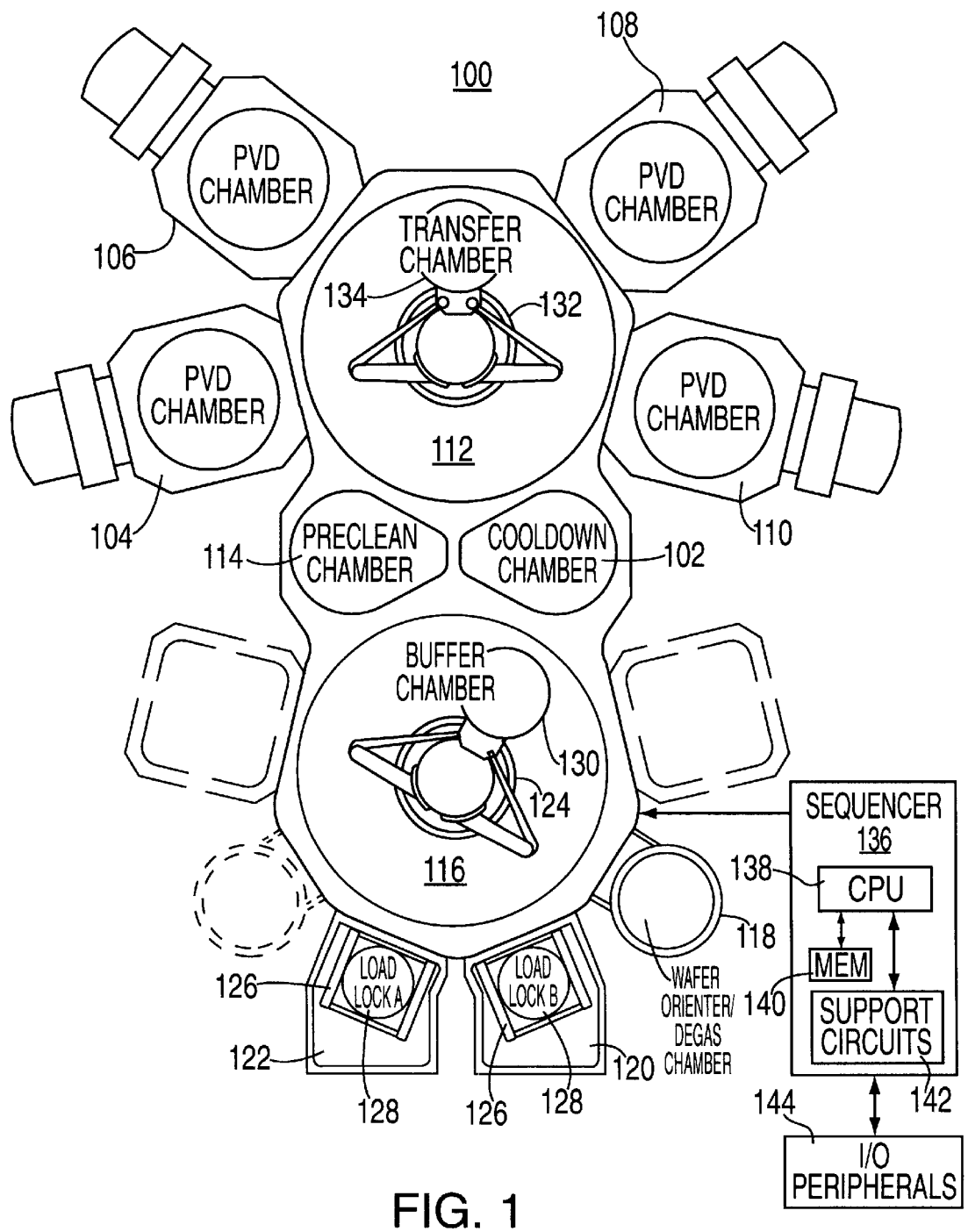
FIG. 1 depicts a schematic block diagram of a multiple chamber cluster tool that operates in accordance with the current invention.

The invention is a plurality of routines that are executed by the sequencer 136 of FIG. 1 to detect and resolve deadlock conditions within a cluster tool. The routines discussed below generally reside in the memory 140 (e.g., RAM, ROM, hard disk, floppy disk, CD ROM, or some combination thereof) and cause the general purpose computer to operate as a specific purpose computer upon execution of the routines by the CPU 138. Before describing the details of the routines of the present invention, an overview of deadlock conditions in a cluster tool is presented.

A. Overview

In order to produce an integrated circuit, a silicon substrate (a wafer) is sequentially subjected to a number physico-chemical processes which are performed by a number of chambers. The order in which these processes are applied to a wafer is called "process sequence." This sequence is predefined and is part of a module (which resides in tool's control system) called a sequencer. Processing capability of a cluster tool is due to mapping of a required process sequence onto the set of chambers. The image of this mapping is called a wafer flow graph (wfg) or just wafer flow. For example, a process sequence $P_1$, $P_2$, $P_3$ may be mapped into four chambers $C_1$, $C_2$, $C_3$, $C_4$ to yield a wafer flow LL→$C_1$→($C_2$v$C_3$)→$C_4$→LL. Note that processes $P_1$ and $P_3$ are mapped into chambers $C_1$ and $C_4$ while process $P_2$ is mapped onto $C_2$v$C_3$ (it is run in both $C_2$ and $C_3$). This wafer flow has three stages: stage 1 with chamber $C_1$, stage 2 with chambers $C_2$ and $C_3$, and stage 3 with chamber $C_4$. Chambers which belong to the same stage are usually identical in which case they are referred to as a family. During a processing, a wafer visits and is processed in exactly one chamber from a given stage.

More formally, a set of one or more chambers which run the same process is called a "stage." The size of a stage is the number of chambers comprising the stage. A stage whose size is at least two is sometimes called a family (of parallel identical chambers). A wafer flow in a tool is "serial" if each stage has exactly one chamber. A wafer flow is "parallels" if the flow is comprised of exactly one stage and the flow is "mixed" if it has at least two stages and at least one stage has size greater than one. Note that above definitions permit a single-chamber flow to be interpreted as either serial or parallel.

If the same process name appears more than once in the processing sequence, a processing loop exists. When processing loops are mapped onto the set of chambers, the wafer flow graph will contain a loop as well. For example, the mapping of the sequence $P_1$, $P_2$, $P_1$ onto the set of chambers $\{C_1, C_2\}$ is the smallest such mapping. Note that if $P_1$, $P_2$, $P_1$ is mapped onto $\{C_1, C_2, C_3\}$ as $P_1 \rightarrow C_1$, $P_2 \rightarrow C_2$, and $P_1 \rightarrow C_3$, the wafer flow will not contain a loop even though the corresponding processing sequence does. Also note that a wafer flow may contain a loop even though the corresponding processing sequence does not (e.g., when $P_1$, $P_2$, $P_3$ is mapped onto $\{C_1, C_2\}$ as $P_1 \rightarrow C_1$, $P_2 \rightarrow C_2$ and $P_3 \rightarrow C_1$).

As shown above, if processing loops are mapped onto the smaller set of chambers, the wafer flow in the tool will have a loop as well. In that case, there must be a chamber whose name appears in at least two different stages. Such chamber is called a "knot" chamber. For example, in a wafer flow $LL \rightarrow C_1 \rightarrow C_2 \rightarrow C_3 \rightarrow C_4 \rightarrow C_2 \rightarrow LL$, chamber $C_2$ is the knot chamber. Consequently, this wafer flow has a loop of length three. A situation in which chambers, $C_2$, $C_3$ and $C_4$ that comprise the loop contain wafers is referred to as a "circular wait." If there is no chamber preemption by a transporter (robot), this circular wait becomes a deadlock. A set of wafers in a cluster tool is in a deadlock state if each wafer in the set is requesting a chamber which is occupied by some other wafer in the set.

A set of wafers enters a deadlock state as a consequence of exclusive access and circular wait. A set of waiting wafers $\{W_1, W_2, \ldots, W_n\}$ forms a circular waiting chain if $W_i$ is waiting for a chamber held by $W_{i+1}$ for i=1,2 . . . , n−1 and $W_n$ is waiting for a chamber held by $W_1$. Such a circular wait condition can arise when the following necessary conditions hold:

A) Wafers request exclusive control of chambers (mutual exclusion condition);

B) Wafers hold chambers allocated to them while waiting for chamber availability (hold and wait condition); and C) Chambers cannot be preempted, i.e., a resource can only be released by the entity holding it after the task is completed (preemption condition).

Figure 2A:
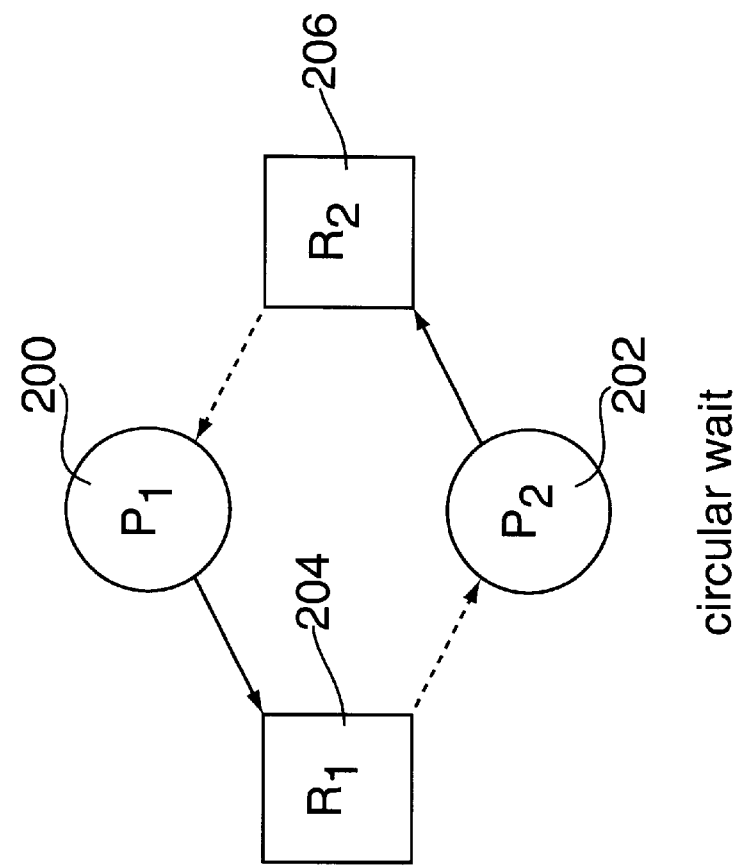
FIG. 2 graphically depicts the smallest circular wait.
Figure 2A:
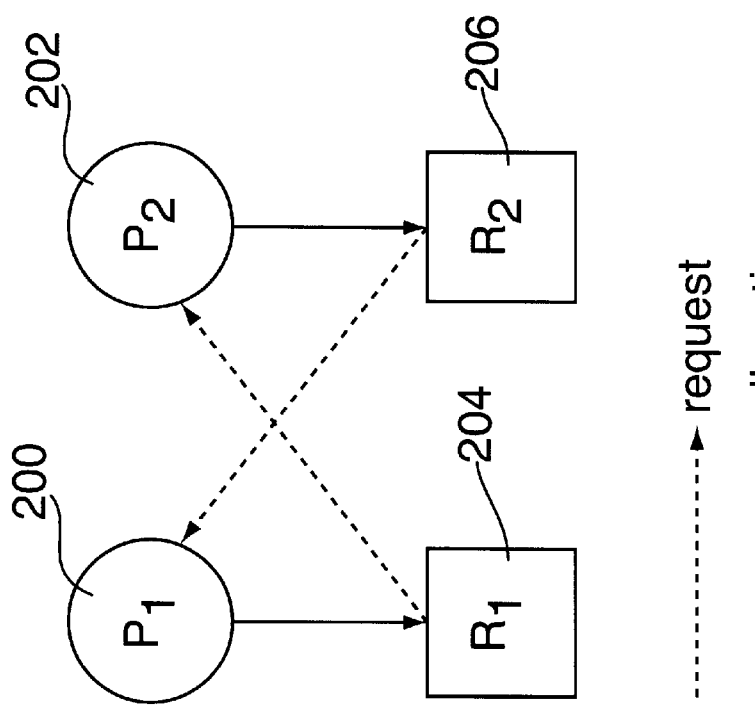

FIGS. 2A and 2B graphically depict an example of the smallest circular wait. Here, two wafers 200 and 202 that were just being processed are waiting to acquire each other's chamber 204 and 206.

Since the possibility of having a deadlock in multichamber systems is a design alternative, deadlocks are dealt with by using sequencing routines which either avoid deadlocks or resolve (break) the deadlock once a deadlock is detected. In other words, a deadlock is dealt with by denying one or more of the above necessary conditions. Thus, the solution to deadlock problem in cluster tools has to be either of the two choices:

a) Deadlock avoidance; and b) Deadlock detection followed by preemption of a chamber in a processing loop to resolve the deadlock.

To perform deadlock avoidance, the invention ensures that a circular wait never occurs by appropriately scheduling the allocation of chambers. Such a scheduling routine is referred to as "deadline scheduling". That is, every time a wafer is to enter the processing loop, the invention ensures that the number of wafers in the processing loop (including the incoming one) is smaller than the capacity of the loop. To calculate the capacity of a processing loop, the routine sums the wafer capacities of the individual chambers comprising the loop. To avoid deadlock, the maximum number of wafers in the loop must be at least one less than the total wafer capacity at any given point in time. Another way to avoid deadlock is through chamber reservation which is made prior to actually moving the wafer into a chamber. Thirdly, in case of multiple capacity transporters, a scheduling routine may be designed so that it is a deadlock avoidance/resolution routine at the same time.

To perform deadlock resolution, wafers are allowed to enter a deadlock state and deadlock is resolved by preempting a chamber. The preemption is accomplished after the deadlock is detected and the chamber to be preempted is finished with processing the wafer. As such, no work is lost by preemption. Deadlock resolution requires either a dual or multiple blade robot or a place where a wafer involved in a circular wait can be stored temporarily. In either case, there may be a loss of throughput due to: 1) running a deadlock detection routine; 2) extra work in handling the deadlocked wafers; and 3) the optimum deadlock handling routine may be inferior to the one applicable to wafer flows without processing loops.

Figure 3:
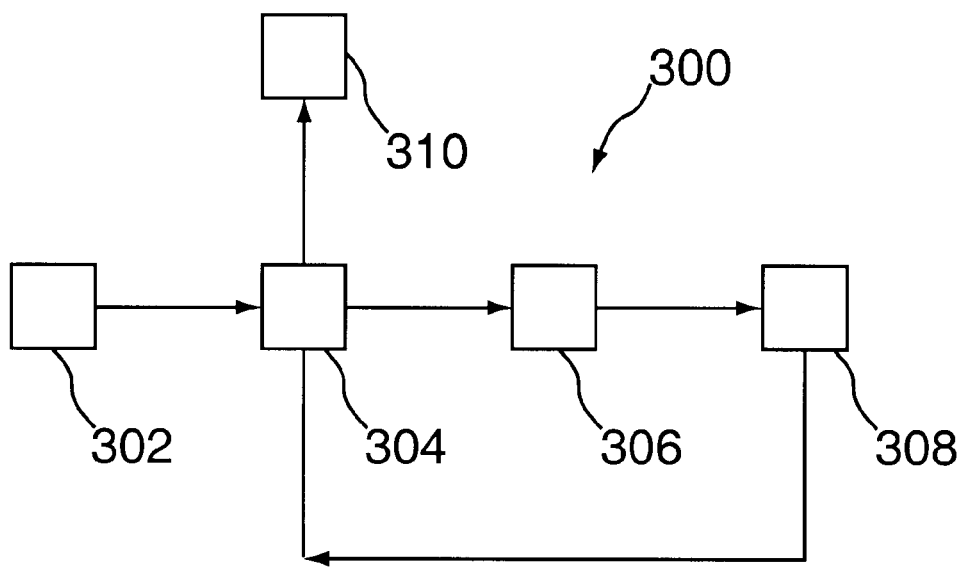
FIG. 3. graphically depicts a wafer flow diagram with one simple processing loop.

It is intuitively obvious that knot chambers are special in terms of resource allocation because they initiate and terminate a processing loop. Thus, knot chambers enjoy a special treatment by scheduling and/or deadlock handling routines. FIG. 3 depicts a wafer flow 300 containing chambers 302, 304, 306, 308 and 310, where a "simple" processing loop is formed of chambers 304, 306, and 308. The knot chamber is chamber 304. A knot chamber has degree one if, as with chamber 304 in FIG. 3, the chamber name appears only in two different stages. Else, its degree is the number of stages the chamber name appears in minus one.

Figure 4:
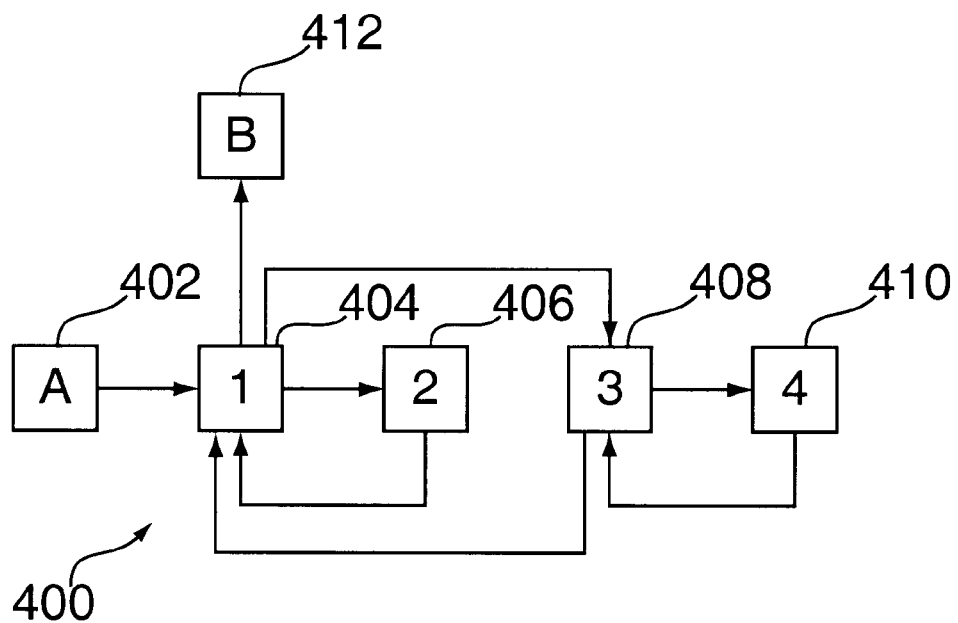
FIG. 4 graphically depicts a wafer flow diagram having multiple nested processing loops.

FIG. 4. depicts a wafer flow 400 containing chambers 402, 404, 406, 408, 410, and 412, with a non-simple loop involving two knot chambers 404 and 408 of degree two. The routines presented below pertain to situations when there is only one knot chamber of degree one in the system (i.e., there is just one loop) as well as when there are multiple loops and knot chambers of higher degree.

Wafers and chambers involved in a deadlock within a processing loop can be represented by a directed bipartite graph G=(V,E) where V is the set of vertices and E is the set of edges (E is a binary relation on V×V). Such a digraph is known as a resource allocation graph. Its description is given below.

Let $C=\{C_1, \ldots, C_n\}$ be the set of all chambers and let $W=\{W_1, \ldots, W_s\}$ be the set of all wafers which are inside a chamber. A wafer involved in a deadlock is always allocated one and is requesting to be moved into another chamber (at the same time as some other wafer). Then $V = C \cup W$ is the set of all vertices of G. Each element from the set of edges E is an ordered pair $(C_i, W_j)$ or $(W_j, C_i)$ where $C_i \in V$ is a chamber and $W_j \in V$ is a wafer. If $(C_i, W_j)$ belongs to E, then there is a directed edge from chamber $C_i$ to wafer $W_j$ meaning that an instance of $C_i$ has been allocated to $W_j$. If $(W_j, C_i)$ belongs to E, then there is a directed edge from wafer $W_j$ to chamber $C_i$ meaning that $W_j$ requested an instance of $C_i$. An edge $(W_j, C_i)$ is called a request edge while an edge $(C_i, W_j)$ is called an assignment edge.

Pictorially, as shown in FIG. 2B, each wafer $W_j$ is represented as a circle and each chamber as a square. Since chamber $C_i$ may have more than one instance, each such instance is represented by a dot within the square. A request edge only points to the square $C_i$ while an assignment edge must also designate one of the dots in the square. When wafer $W_j$ requests an instance of chamber $C_i$ a request edge is inserted in the resource allocation graph. When this request can be granted, the request edge is transformed into an assignment edge at once. When wafer leaves the chamber, the assignment edge which corresponds to that chamber is deleted.

By definition of a resource allocation graph, if the graph contains no cycles note that a processing loop maps onto a digraph as a "cycle", then there is no possibility of a circular wait and thus no wafer in the tool is or can be deadlocked. If the graph contains a cycle, a deadlock may or may not exist. If there is exactly one instance of each chamber type, then a cycle in the resource allocation graph implies the existence of a deadlock and each wafer in the cycle is deadlocked. If there is at least one chamber type with several instances, then a cycle does not necessarily imply that a deadlock took place. In other words, if there is exactly one instance of each chamber type, a cycle in the resource allocation graph is a necessary and sufficient condition for the existence of a deadlock. If there are multiple instances of at least one chamber type, a cycle in the resource allocation graph is a necessary but not a sufficient condition for the existence of a deadlock.

Once the above described association is established, all that remains is to apply routines which list all cycles in a given digraph. In this way the invention can detect a deadlock and, if a deadlock is present, resolve the deadlock by using either a single-blade or a dual blade robot.

To facilitate an understanding of the routines of the present invention for deadlock handling, denote by A a routine which lists all cycles in a given digraph. In case of deadlock detection, A should be executed every time a requested knot-chamber is reported busy. The sequencer can use routine A for deadline scheduling as well as deadlock detection. If an arbitrary wafer requests a chamber from a processing loop, the request is tentatively granted and routine A is executed. If there are no cycles in the corresponding digraph, the allocation is made real and wafer is moved into the requested chamber. Else, the request is postponed until a change in conditions is detected at which point the routine is executed again. The system only needs to monitor changes in conditions involving wafers in the processing loop. A well designed routine A will have polynomial run-time complexity in the number of vertices (or edges). Since this number is small for a cluster tool, there should be no delay observed due to running the routine.

Another digraph associated to a deadlock problem is obtained from the wafer flow directly by identifying chambers with vertices and wafer flows with edges. The outgoing cassette (load lock) is the start vertex and the incoming cassette (load lock) is the termination vertex. A cycle in such a digraph corresponds to a processing loop in the tool.

The simplest unique representation of digraphs is either via adjacency matrices or via adjacency lists. Either representation enables finding all cycles and knot chambers in polynomial time. The preferable choice depends on the operations that will be applied to the vertices and edges of the digraph. Let $G=(V,E)$ where $V=\{1, 2, \ldots, n\}$. A directed edge is an ordered pair of vertices $(i, j;$ $i$ is called the "tail end" $j$ the "head" of the edge. The edge $(i, j)$ is often expressed by $i \rightarrow j$ and drawn as an arrow from point i to point j. Note that the "arrowhead" is at the vertex called "head" and the tail of the arrow is at the vertex called "tail". As such, the edge $i \rightarrow j$ is from i to j, and j is referred to as being adjacent to i.

The adjacency matrix for G is an n×n matrix A of Boolean values (i.e., true or false), where the element $A[i, j]$ is true if and only if there is a directed edge from vertex i to vertex j. Often, as depicted in TABLE 1, adjacency is exhibited with 1 for true and 0 for false.

TABLE 1

|    | L1 | C1 | C2 | C3 | L2 |
|----|----|----|----|----|----|
| L1 | 0  | 0  | 0  | 0  | 0  |
| C1 | 1  | 0  | 0  | 1  | 0  |
| C2 | 0  | 1  | 0  | 0  | 0  |
| C3 | 0  | 0  | 1  | 0  | 0  |
| L2 | 0  | 1  | 0  | 0  | 0  |

Through the mapping of a digraph into its adjacency matrix, the invention uniquely obtains a wafer flow size of $LL_1 \rightarrow C_1 \rightarrow C_2 \rightarrow C_3 \rightarrow C_1 \rightarrow LL_2$. In this representation, the time to access an element is independent of the V and E. The main disadvantage of using an adjacency matrix to represent a wafer flow is that the matrix requires storing $n^2$ edges. Simply to read or examine the matrix would require $O(n^2)$ time, which would preclude $O(n)$ routines for manipulating digraphs with $O(n)$ edges.

The adjacency list representation of a digraph requires storage proportional to the sum of number of vertices plus the number of edges. It is used in large (sparse) digraphs when the number of edges is much less than $n^2$. The adjacency list for a vertex i is a list, in some order, of all vertices adjacent to i. Furthermore, $G=(V,E)$ can be represented as an array head, where head [i] is a pointer for the adjacency list for vertex i. A potential disadvantage of the adjacency list representation is that it may take $O(n)$ time to determine whether there is an edge from vertex i to vertex j, since there can be $O(n)$ vertices on the adjacency list for vertex i.

B. Deadlock Avoidance

Deadlock avoidance is based on denying chamber acquisition in an "unsafe" state such that the system will never enter deadlock state. A deadlock avoidance routine of the present invention examines either a) the state of the requested chamber or b) the state of the loop to assure that there will never be a circular wait condition. Thus, the inventive deadlock avoidance routines perform either:

a) Deadlock avoidance by chamber reservation; or b) Deadlock avoidance by deadline scheduling. The deadlock avoidance routine presently used in the model Endura cluster tool manufactured by Applied Materials, Inc. of Santa Clara, Calif. is the simplest example of (a). The routine is limited to deadlock avoidance in simple loops (i.e., when there is only knot chamber and it has degree one) and pertains to single-blade robots in the transfer space of the cluster tool. It uses one-step look-ahead as follows:

After wafer W finishes processing, its target chamber movement is determined. A check is performed on the target chamber of W to determine whether there is another wafer that is older which will use this chamber in its next step. If so, the acquisition of the target chamber by W is postponed. Clearly, in this case, W's target chamber is the knot chamber. Thus, the knot chamber is claimed by W only if there is no older wafer with a prior claim (reservation) of the knot chamber.

Note that wafer W above is chosen according to the scheduling routine for single-blade robot in the transfer space of the cluster tool. It is possible to extend the domain of validity to multiple and/or nested loops as well as to improve the run time performance of the above routine by Hierarchical ordering of wafer requests; and Checking (before acquisition) only knot chambers (rather than every chamber).

Another way to avoid circular waits is to compare the loop capacity with number of wafers in the loop. To prevent circular wait, the routine should maintain the number of wafers in the loop smaller than the capacity of the loop. So, a wafer outside the loop will be able to acquire a knot chamber, only if, at the instance of acquisition, the capacity of the loop exceeds the number of wafers in the loop by at least two. This can be implemented by adding a new state "busy deadlock" to the knot chamber (in addition to busy-processing and busy-clean that are presently used in scheduling routines). A flag indicating the busy deadlock is set whenever there are N−1 wafers in a loop of capacity N for a single blade robot or N wafers in a loop of capacity N for a dual-blade robot. Thus, a knot chamber is associated with a counter whose value increases by one when wafer leaves the loop. Clearly, the scheduling routine should only be slightly altered to take this new state into account.

The essential part of deadline scheduling is in allocation of a knot-chamber. Knot-chamber allocation can be represented as, $$LL_{1pullout;zu844300.9002} \to C_1 \to \bullet\bullet\bullet \to C_{i-1} \to C_i \to \bullet\bullet\bullet \to C_{k-1} \to C_k \to C_i \to C_{k+1} \to \bullet\bullet\bullet \to C_n \to LL_{1pullout;zu844300.9002}$$

where a knot-chamber $C_i$ is allocated in transitions $C_{i-1} \to C_i$ and $C_k \to C_i$. Additionally, subtrace $$C_i \to C_{i-1} \to \bullet\bullet\bullet \to C_{k-1} \to C_k \to C_i$$

constitutes a processing loop. When a wafer from either chamber $C_{i-1}$ or chamber $C_k$ request a knot-chamber $C_i$, two things have to be known prior to allocating $C_i$ to a requesting chamber:

a) is this a transition $C_{i-1} \to C_i$ or a transition $C_{k-1} \to C_i$; and b) how many wafers are inside the processing loop at that instant.

It is easy to see that, if granted, the transition $C_k \to C_i$ leaves $C_k$ empty and thus helps avoid a deadlock. On the other hand, postponing the transition $C_{i-1} \to C_i$ will certainly decrease the throughput of the system.

Given that both chambers $C_k$ and $C_{i-1}$ have requested moving their respective wafer into the knot chamber, a decision must be made as to whether $C_{i-1} \to C_i$ or $C_k \to C_i$ should be scheduled first. To decide, it will be convenient to define a subtrace $$L := C_{i+1} \to C_{i+2} \to \bullet \to C_{k-1} \to C_k$$

where $|L|$ is defined as the number of chambers in L that represent the number of chamber in the loop minus one, the knot chamber. If the subtrace has only one instance of each chamber, then $|L|=k-i$; else multiple instances of chambers have to be counted in $|L|$. The number of wafers in subtrace L at instant t is denoted by L(t). Successive requests $C_{i-1} \to C_i$ and $C_k \to C_i$ are issued at instants $t_{i-1}$ and $t_k$, respectively.

The allocation of a knot-chamber $C_i$ is then made according to the following two rules and in the order indicated below:

1. If there is a request $C_{i-1} \to C_i$, then
   a) if $L(t_{i-1}) < |L|$, then allocate $C_i$ to the wafer from $C_{i-1}$;
   b) if $L(t_{i-1}) = |L|$, then deny the request.
2. If there is a request $C_k \to C_i$, then
   a) if $L(t_k) = |L|$ or $L(t_k) < |L|$ and $|t_k - t_{i-1}| \geq T_i''$, then allocate $C_i$ to the wafer from $C_k$;
   b) if $L(t_k) < |L|$ and $|t_k - t_{i-1}| \geq T_i''$, then deny the request, where $T_i'$ is the processing time for a wafer visiting $C_i$ for the first time (the wafer arrived from outside the loop); and $T_i''$ is the processing time for a wafer visiting $C_i$ for the second time (the wafer arrived from inside the loop).

Figure 11:
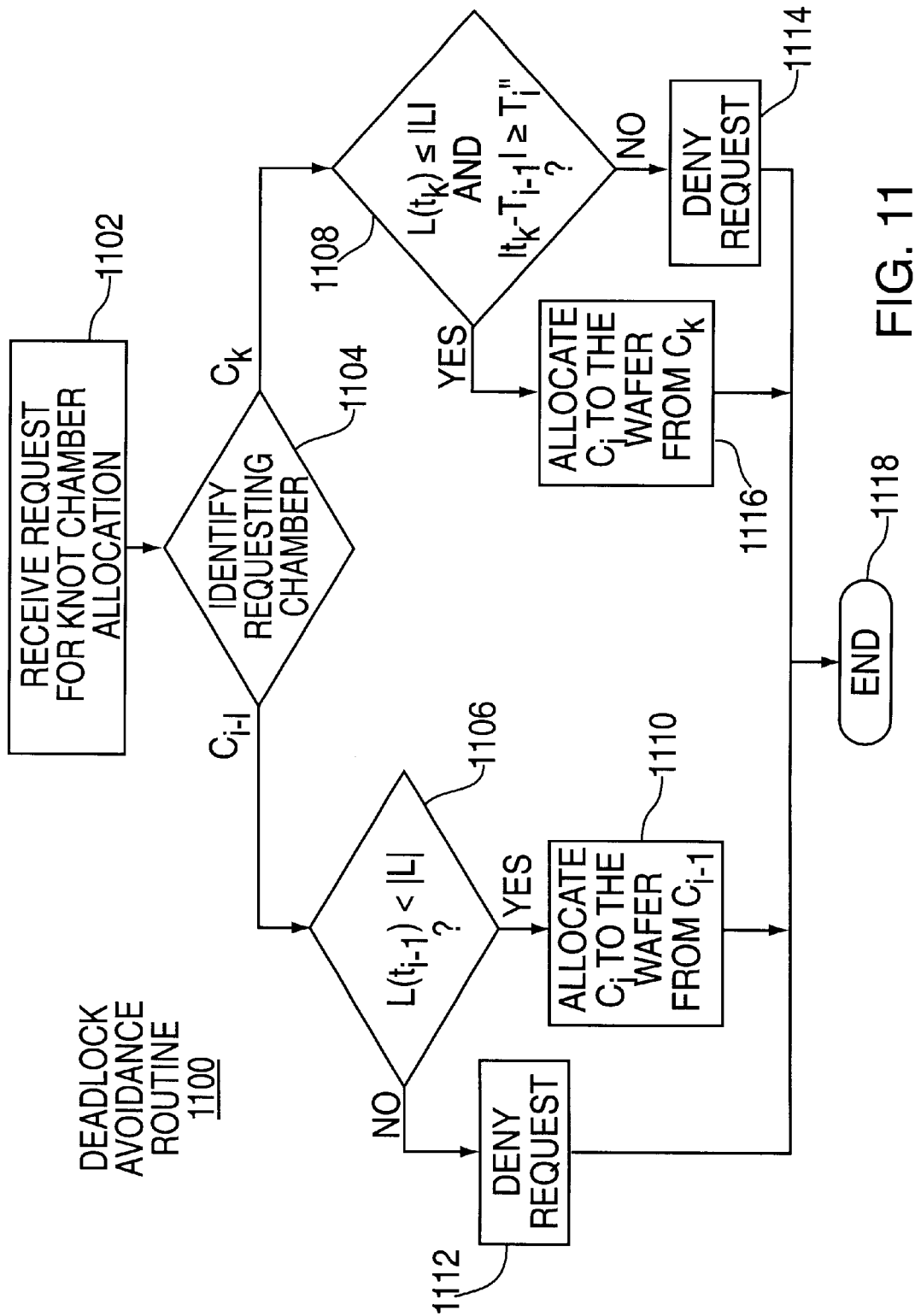
FIG. 11 depicts a flow diagram of a deadlock avoidance routine of the present invention.

FIG. 11 depicts a flow diagram of a deadlock avoidance routine 1100 in accordance with the invention. The routine 1100 begins at step 1102 when a request for the allocation of a knot-chamber $C_i$ is "received". At that time, the routine first identifies, at step 1104, a wafer that needs to be moved into $C_i$. If the wafer is from chamber $C_{i-1}$ the routine executes, at step 1106, either (1a) or (1b) above and depending upon the availability of chamber $C_i$, the knot-chamber is either allocated (step 1110) or the request is denied (step 1112). If the wafer is from $C_k$, the routine executes, at step 1108, either (2a) or (2b) above and depending upon the availability of $C_i$, the knot-chamber is either allocated (step 1116) or the request is denied (step 1114). The routine ends at step 1118. The logic of the allocation process is to allocate $C_i$ to a wafer from $C_{i-1}$ whenever there is no danger of a deadlock. It can be shown that, for all processing times of practical interest, "feed-first" is preferable over "clear-first" if a high throughput is to be maintained.

The routine of FIG. 11 requires look-ahead within the window of $T_i''$ seconds. That is, if a wafer from chamber $C_k$ has a request for the knot-chamber $C_i$ at instant $t_k$, the routine looks for a possible request for chamber $C_i$ to move a wafer currently in $C_k$ (if any) in the interval $[t_k, t_k + T_i'']$. Depending on the presence or absence of such a request and the value of $L(t_k)$ it executes either (2a) or (2b). In other words, the routine prioritizes the requests for access to the knot chamber. In the embodiment of FIG. 11, priority is given to the chamber $C_{i-1}$ that is requesting to have a wafer moved into the knot chamber from outside of the processing loop.

At steps 1112 and 1114, denied requests (either $C_{i-1} \to C_i$ or $C_k \to C_i$) are stored and the allocation of chamber $C_i$ is made later. In (1b), the allocation is made after $C_i$ finishes processing a wafer from $C_k$ while in (2b) the allocation is made after $C_i$ finishes processing a wafer from $C_{i-1}$. In (1b), the delay in allocation is because of a deadlock, while in (2b) the delay is required to improve the throughput of the system.

The routine requires the knowledge of processing times $T_i'$ and $T_i''$, one fixed integer $|L|$ and one time dependent integer L(t). The variable D(t) is easily derived from a "resource allocation table" which is contained in the sequencer program. The resource allocation table contains the information such as which wafer is in which chamber, the remaining processing time in that chamber, the next chamber a wafer has to visit (trace), and so on. Depending on the way this data is stored, calculating L(t) should not take more than O(n) seconds. Since n is small, the time it takes to run the program is relatively negligible.

C. Deadlock Detection Routines

The term "deadlock detection" involves detecting a circular wait within a processing loop. Such detection is the preliminary step in resolving (breaking) a deadlock.

Depending on the status of chambers in the loop (finished processing or not), there are two routines useful in deadlock detection.

A first deadlock detection routine (DD1) returns to the scheduler (i.e., a scheduling routine executing on the sequencer) a Boolean Yes if there is a circular wait and No if there is a not a circular wait involving a given wafer. If there is a circular wait, the routine returns to the scheduler a list of all wafers (or chambers) involved in the circular wait. The routine is initiated by a wafer which completed processing and is ready to leave its chamber and be moved to a target chamber. Other wafers involved in a circular wait do not have to be ready to leave their respective chambers; they may still be in the processing state.

A second deadlock detection routine (DD2) returns to a scheduling routine a chamber identifier that identifies the knot chamber if there is a circular wait involving wafers which are all being processed and thus each of the wafers is ready to leave its respective chamber. The DD2 routine is executed every time a chamber call is issued, i.e., whenever a wafer is finished processing and requests movement to another chamber regardless of its position in the wafer flow.

The choice of a deadlock detection routine to be employed (DD1 or DD2) depends on what one wants to do once a circular wait is detected. In a system using a single blade robot, in order to move a wafer and resolve a deadlock, at least one wafer must be taken out of the processing loop into a discretionary location (e.g., an empty chamber or a load lock). An empty chamber dedicated to (temporarily) holding wafers from the processing loop is referred to herein as a "Penalty Box" (PB). A wafer chosen to leave the processing loop will be called a "victim wafer" or just a victim. The term victim wafer, is borrowed from page (or segment) replacement concepts and strategies ("victim page" and the choice of a victim page, e.g. FIFO, LIFO, least remaining time) in multi-programmed operating systems.

In routine DD1, the victim can be any wafer in the processing loop which is ready to leave its chamber. This includes the wafer within the chamber which initiated the execution of DD1 to discover that the requesting chamber's own wafer is involved in a circular wait. When a wafer W in the chamber $C_W$ finishes processing, routine DD1 is executed by he sequencer to determine if there is a circular wait. A circular wait involving W is detected when all of the possible chambers that wafer W could be routed to in future steps of the schedule have a wafer inside them and at least one of these wafers has $C_W$ as its target chamber. If this occurs, a circular wait already happened or is about to happen. Among all wafers which finished processing, one or more wafers will be moved out of the loop and put into the penalty box. The choice of victim wafer(s) should be made so that the tool's throughput is maximized. Clearly, potential victim wafers occupy different positions in the wafer flow, have different positions with respect to the robot, and have different remaining processing time. So, it must be relevant which one is sent into the penalty box. This choice can be made with respect to 1) the length of processing times, 2) chamber position, 3) remaining time in the loop, and so on, by running a throughput simulator. The optimum choice of victim wafer(s) with respect to tool's throughput is determined by an exhaustive off-line search.

In all routines below, succ(Z) denotes a target (successor) chamber within a schedule for the wafer in chamber Z. Note that in serial traces having a single processing loop (simple loops), succ(Z) is unique for all values of Z except when Z is the knot chamber.

The following is a psuedocode representation of the DD1 routine:

1. (Initialize.) If chamber C is finished processing (chamber call issued), store the chamber identifier C and mark C done to indicate to the scheduling routine that chamber processing is complete for chamber C, set X→C and go to Step 2. (X is a loop variable with initial value C.)

2. If succ(X) is empty and not reserved or succ(X) is a load lock, then go to Step 3. Else if succ(X)=C, go to step 4. Else, go to Step 5.

3. Stop. Return NO. (Circular wait not found because a target chamber is empty or a loadlock that can accommodate a wafer.)

4. Stop. Return YES. (Circular wait found.) Return a list of all wafers involved in the circular wait. Return a list of a subset of chambers which are finished processing (chambers which, in addition to chamber C, are marked done).

5. (Advance the target chamber by one.) X←succ (X). Record X. If X is finished processing, mark X done. Go to Step 2.

Figure 5:
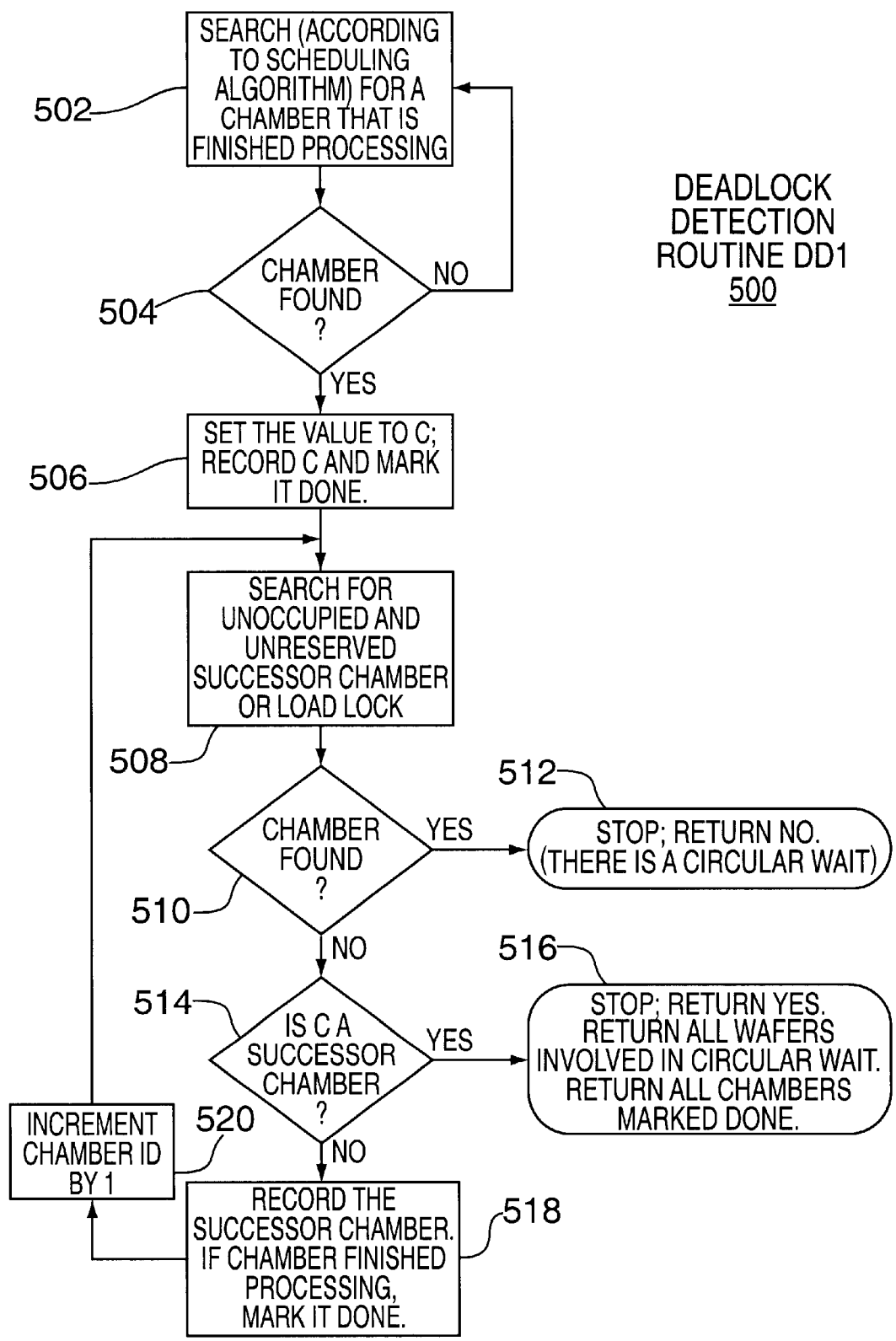
FIG. 5 depicts a flow diagram of a first deadlock detection routine DD1.

FIG. 5 is a detailed flow diagram representation of the steps accomplished by the DD1 routine 500. This routine requires storing the adjacency matrix (or adjacency list) or a data structure from which an adjacency matrix can be derived. When an adjacency matrix is used, the run-time complexity of the above routine is O(n), where n is the number of chambers.

Routine 500 begins with step 502 where a search of all the chambers in a tool is accomplished by polling each chamber to find a chamber that is finished processing a wafer. This search is accomplished in accordance with the scheduling routine such that the selected wafer and chamber combination for the move fulfills a process sequence step. At step 504, the routine queries whether a chamber has been found. If the query is negatively answered because none of the chambers have completed processing, the routine proceeds back to step 502. However, if the query is affirmatively answered, the routine proceeds to step 506.

At step 506, a chamber identifier variable is set to C, the chamber that has just completed processing. At this step, the value C is stored (recorded) in a database of tool status information and the chamber is marked in that database as "done" to indicate that the chamber has completed processing its wafer. At step 508, a search of a schedule for the wafer is accomplished to identify an unoccupied and unreserved successor chamber (i.e., succ(X)) or load lock that fulfills the requirement of the next sequence step for the wafer. At step 510, the routine queries whether an appropriate chamber has been found. If the query is affirmatively answered, the routine proceeds to step 512 where the routine stops and returns a NO indicating to the scheduler that a circular wait has not occurred. However, if the query of step 510 is negatively answered, the routine proceeds to step 514. At step 514, the routine queries whether chamber C is a possible successor chamber. If the query is affirmatively answered, the routine proceeds to step 516 where the routine stops and returns a YES to the scheduler indicating the existence of a circular wait. Upon the YES indication, the routine supplies to the scheduler the identity of all wafers involved in the circular wait and marks all the chambers whose wafers were identified in the circular wait as done.

If the query of step 514 is negatively answered, the routine proceeds to step 518, where the routine stores (records) the successor chamber identification (X) in the scheduler database and, if the successor chamber is finished processing, marks it as done. The routine, at step 520, increments the chamber identifier by one and then returns to step 508 to search for a successor chamber of the next chamber in the schedule. By looping through steps 508, 510, 514, 518, and 520, the routine 500 determines all the chambers in the schedule for the wafer in chamber C and determines if chamber C is in a loop and whether that loop forms a circular wait. Thus, each time a chamber completes processing, this routine 500 determines the deadlock status for the completed wafer.

In the second deadlock detection routine DD2, the victim is a wafer from the knot chamber. If all wafers are finished processing and the system is deadlocked, it makes sense to remove the wafer from the knot chamber first in order to enable the shift of wafers in the loop by one position.

To identify the knot chamber, each chamber in the wafer flow is examined to see if it is a target chamber of a downstream wafer. For example, if we denote chambers in the tool as $C_1, C_2, \ldots, C_n$ in the order implied by the wafer flow, the general form of a knot chamber identification routine can be represented by the following psuedocode:

1. (Initialize.) i←1 and k←1. Go to Step 2.
2. If i=n+1, then stop (the search is over). Else if k=n−i+1, then i←i+1. Else, k←k+1. Go to Step 3.
3. If $C_i$ is the target chamber for the wafer inside $C_{j+k}$ go to Step 4. Else, go to Step 2.
4. Return i,k and $C_i$. Go to Step 2.

To identify a knot chamber, the foregoing routine uses two nested loops. The outer loop checks all chambers in the system that are finished processing for a potential knot chamber. For any fixed value (chamber identification) in the outer loop, say chamber C, the inner loop checks chambers downstream of C to find a chamber which is finished processing and whose wafer has chamber C as its target chamber. If X is a chamber downstream of C such that C is the target chamber for the wafer in X, then C is the knot chamber.

In the DD2 routine described below, C and X, represent variables (chambers) in the outer and inner loops, respectively. FirstChamber and LastChamber are the first and last chamber in a given wafer sub-flow which is being examined for the knot chamber. In the absence of a data structure representing the wafer flow graph, the routine must be executed for each wafer in the robot space, i.e., not only the wafers that are in the processing loop.

The DD2 routine can be represented by the following pseudocode:

1. (Initialize the outer loop.) FirstChamber←C. Go to Step 2.
2. If chamber C is not finished processing, go to Step 3. Else (C is finished processing), put C←X and go to Step 4.
3. If C-LastChamber, STOP (no circular wait found). Else (advance the variable in the outer loop), C←succ(C) and go to Step 2.
4. If succ(X) is empty and not reserved or succ(X) is not finished processing, go to Step 3. Else if succ(X)=C, go to Step 5. Else, go to Step 6.
5. Stop. Return C. (There is a circular wait and C is the knot chamber. A wafer from C will be moved into the penalty box.)
6. If X=LastChamber, go to Step 3. Else (advance the variable in the inner loop), X←succ(X) and go to Step 4.

Figure 6:
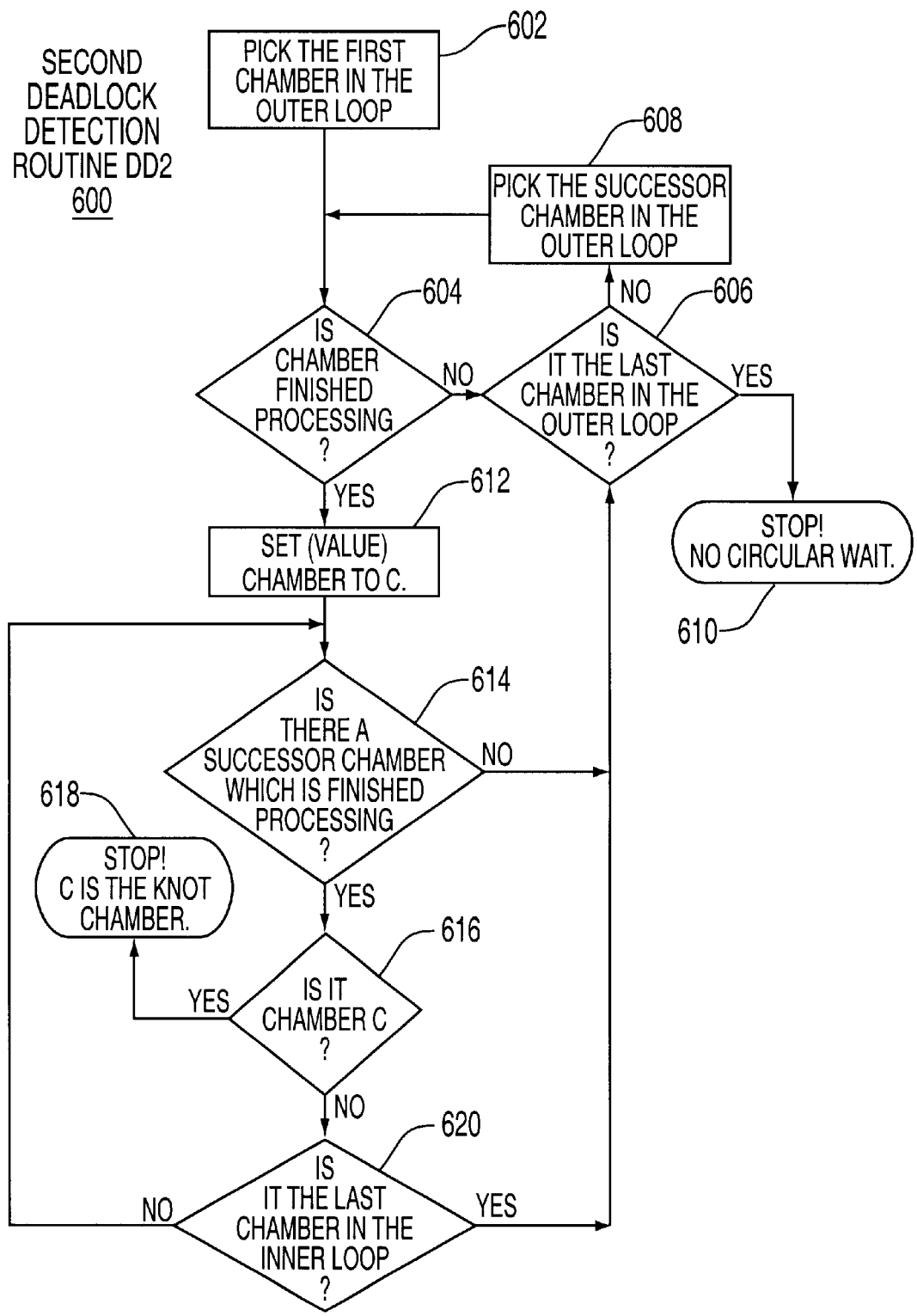
FIG. 6 depicts a flow diagram of a second deadlock detection routine DD2.

FIG. 6 depicts a detailed flow diagram that corresponds to the foregoing pseudocode representation of routine DD2 600. As with DD1, the routine requires storing the adjacency matrix (or adjacency list) or a data structure from which an adjacency matrix can be derived. When adjacency matrix is used, the run-time complexity of the above routine is $O(n^2)$, where n is the number of chambers.

The routine 600 begins at step 602 by selecting a first chamber in the outer loop of the nested loops in the wafer flow. At step 604, the routine queries whether the selected chamber is finished processing. If the query is negatively answered, the routine proceeds to step 606, where the routine then queries whether the selected chamber is the last chamber in the outer loop. If the chamber is not the last, then the routine proceeds to step 608, where the routine selects the successor chamber in the outer loop. If the query at step 606 is affirmatively answered, the routine stops at step 610 and informs the scheduler that no circular wait exists.

If, on the other hand, at step 604, the query is affirmatively answered, the routine proceeds to step 612.

At step 612, the routine sets the chamber value to the selected chamber, e.g., C. At step 614, the routine queries whether a successor chamber is finished processing. If the query is negatively answered, the routine proceeds to step 606 described above. If the query is affirmatively answered, the routine proceeds to step 616, where the routine queries if the successor chamber is chamber C. If the query of step 616 is affirmatively answered, then at step 618 the routine stops and informs the scheduler that chamber C is the knot chamber. If, at step 616, the query is negatively answered because the successor chamber is not chamber C, the routine proceeds to step 620. At step 620, the routine queries whether the chamber is the last chamber in the inner loop. If the chamber is not the last in the inner loop, the routine proceeds to step 614. However, if the chamber is the last chamber in the inner loop, the routine proceeds to step 606. In this manner, routine DD2 identifies the knot chamber in a circular wait of a processing loop having nested loops.

D. Deadlock Resolution for Single Blade Robots

In multi-chamber tools, deadlock resolution (or breaking the deadlock) is accomplished by chamber preemption and must be performed without loss of work and damage to the wafer. For single blade robot (SBR), the deadlock resolution routines which utilize deadlock detection routines DD1 and DD2, are described below. As such, the deadlock detection routine is used to detect that a deadlock exists and then further action is taken to resolve the deadlock.

A first deadlock resolution routine DR1 that incorporates the features of deadlock detection routine DD1 is represented by the following pseudocode:

1. If there are no wafers in the penalty box whose target chamber is ready (i.e., empty and not busy clean), go to Step 2. Else (there is a ready target chamber), put the wafer into its target chamber and go to Step 1.
2. For each wafer which is finished processing, run deadlock detection routine DD1. If circular wait is detected, go to Step 4. Else (no circular wait) go to Step 3.
3. If target chamber is empty and not busy clean, move the wafer to the target chamber. Go to Step 1.
4. Move the victim wafer(s) out of the processing loop into the penalty box. Go to Step 1.

Note that the choice of a target chamber in Step 3, is according to the scheduling routine for single-blade robot. The same holds for returning wafers from the penalty box into the processing loop. The highest priority here is given to a wafer whose target chamber satisfies the conditions of the scheduling routine at that moment. The victim wafer(s) in Step 4 are chosen from the chambers returned by DD1 which are marked done.

Figure 7:
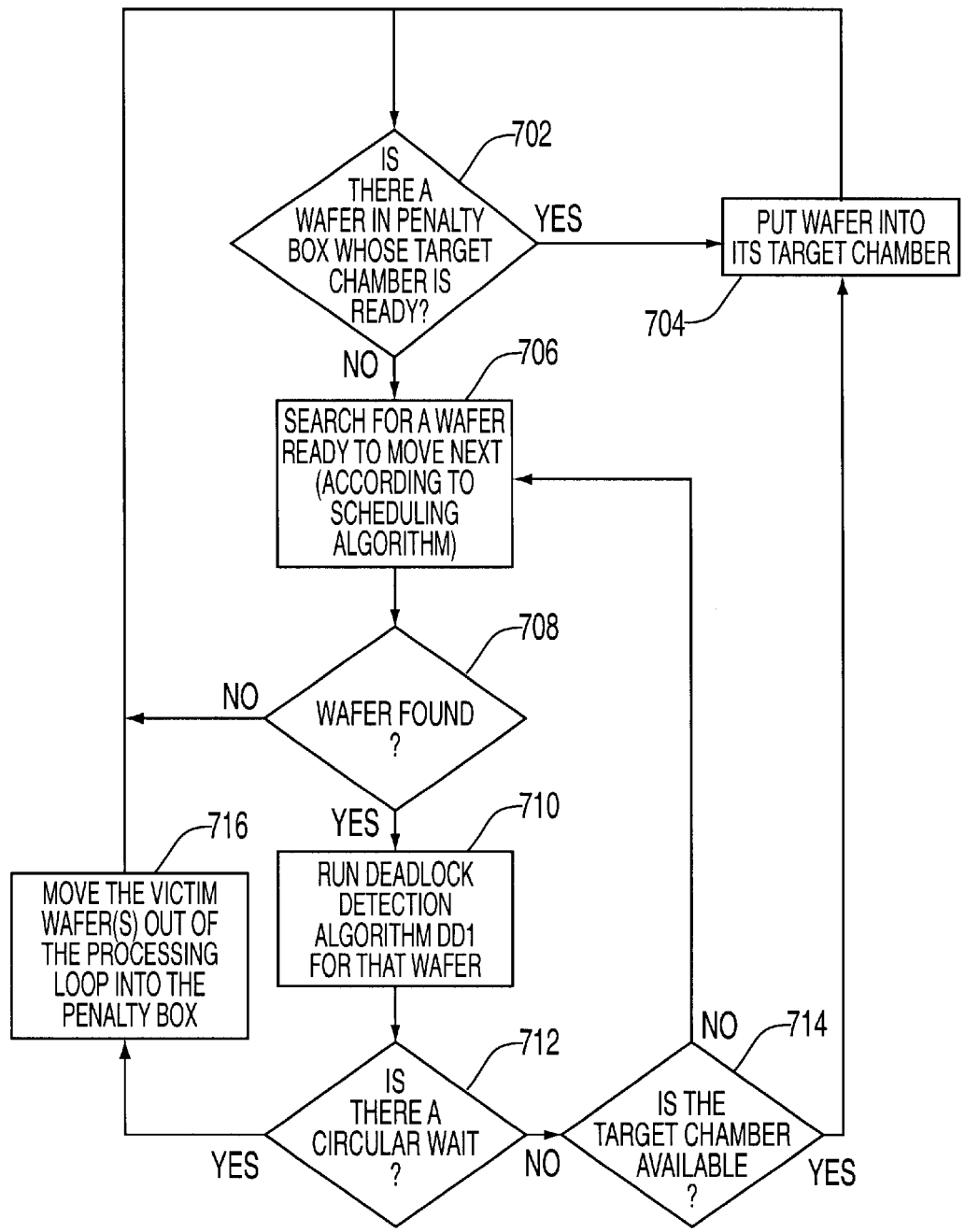
FIG. 7 depicts a flow diagram of a deadlock resolution routine DR1 based on DD1.

FIG. 7 depicts a flow diagram of the routine DR1 700 that corresponds to the foregoing pseudocode. The routine 700 begins at step 702, where the routine queries whether there is a wafer in the penalty box whose target chamber is ready. If the query is affirmatively answered, the routine proceeds to step 704 and the routine places the wafer into the target chamber, then returns to step 702. If, however, the query is negatively answered, the routine proceeds to step 706. At step 706, the routine searches for a wafer that is ready to be moved to another chamber or load lock in accordance with the scheduling routine.

At step 708, the routine queries whether a wafer has been found by the search. If none of the wafers are ready, then the routine proceeds from step 708 to step 702 and begins the search again. However, if a wafer in the system is ready, the deadlock detection routine DD1 of FIG. 5 is executed at step 710. Once DD1 determines whether a circular wait exists, the routine 700 queries at step 712 whether a circular wait exists. If the query is affirmatively answered, the routine proceeds to step 716, where the victim wafer(s) are moved from the processing loop into the penalty box to resolve the deadlock. Then the routine proceeds back to step 702.

If a circular wait does not exist at this time, the query of step 712 is negatively answered and the routine proceeds to step 714. At step 714, the routine queries whether a target chamber is available. If the target chamber is not available, the routine proceeds to step 706 and begins searching for the next wafer to be moved. On the other hand, if the target chamber is available, the routine proceeds to step 704 and the wafer is placed in the target wafer.

Consequently, the routine DR1 resolves the deadlock by moving wafers into a penalty box. At the first available opportunity, wafers in the penalty box are moved to a target chamber to continue processing.

When deadlock resolution using an SBR is based on deadlock detection routine DD2, the routine always moves the wafer from the knot chamber into the penalty box. Thus there is only one wafer in the penalty box at a time. To maximize throughput, a second deadlock resolution routine DR2 that comprises the second deadlock detection routine DD2 is represented in the following pseudocode:

1. If there is no wafer in the penalty box whose target chamber is ready (empty and not busy clean), go to step 2. Else (there is a ready target chamber), put the wafer into its target chamber and go to Step 1.

2. For each wafer which is finished processing, run deadlock detection routine DD2. If circular wait is detected, go to Step 4. Else (no circular wait) go to Step 3.

3. If target chamber is empty and not busy clean, move the wafer in. Go to Step 1.

4. Move the victim wafer out of the knot chamber into the penalty box. Go to Step 1.

There are two differences between deadlock resolution routines DR1 and DR2. First is in which deadlock detection routine is run in Step 2 (DD1 for DR1 and DD2 for DR2)). Second is in the choice of victim wafer(s) in Step 4. In DR1, they are determined by simulation ahead of time on a case by case basis to maximize the throughput; in DR2, the victim wafer always comes from the knot chamber after all wafers in the loop are finished processing.

Figure 8:
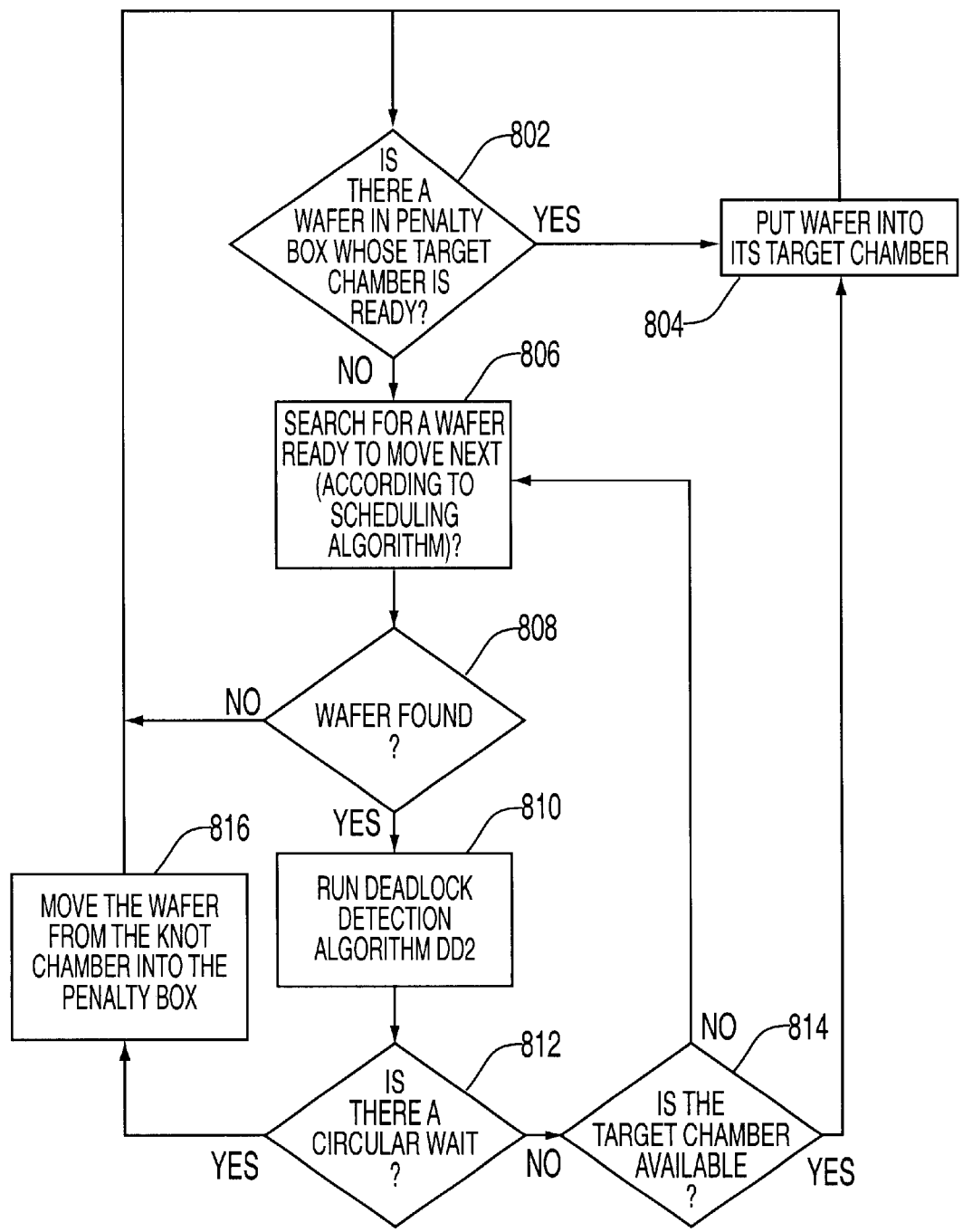
FIG. 8 depicts a flow diagram of a deadlock resolution routine DR1 based on DD2).

FIG. 8 depicts a flow diagram of the second deadlock resolution routine DR1 800 corresponding to the routine of the foregoing pseudocode. The routine 800 begins at step 802, where the routine queries whether there is a wafer in the penalty box whose target chamber is ready. If the query is affirmatively answered, the routine proceeds to step 804 and the routine places the wafer into the target chamber. If, however, the query is negatively answered, the routine proceeds to step 806. At step 806, the routine searches for a wafer that is ready to be moved to another chamber or load lock in accordance with the scheduling routine.

At step 808, the routine queries whether a wafer has been found by the search. If none of the wafers are ready, then the routine proceeds from step 808 to step 802 and begins the search again. However, if a wafer in the system is ready, the deadlock detection routine DD2 of FIG. 6 is 15 executed at step 810. Once DD2 determines whether a circular wait exists, the routine 800 queries at step 812 whether a circular wait exists. If the query is affirmatively answered, the routine proceeds to step 816, where the victim wafer(s) are moved from the knot chamber into the penalty box to resolve the deadlock. Then the routine proceeds back to step 802.

If a circular wait does not exist at this time, the query of step 812 is negatively answered and the routine proceeds to step 814. At step 814, the routine queries whether a target chamber is available. If the target chamber is not available, the routine proceeds to step 806 and begins searching for the next wafer to be moved. On the other hand, if the target chamber is available, the routine proceeds to step 804 and the wafer is placed in the target wafer.

Consequently, the routine DR2 identifies a deadlock circular wait and resolves the deadlock by moving a wafer from the knot chamber into a penalty box. At the first available opportunity, a wafer in the penalty box is moved to a target chamber to continue processing.

D. Deadlock Handling Using A Dual Blade Robot

When a dual-blade robot is used in the transfer space of a cluster tool, the knot chamber is preempted by a blade which acts as a buffer in wafer swaps. As with single blade robots, by design, the scheduling routine here incorporates deadlock handling as well. The starting point in the sequence of wafer exchanges depends on the direction of the wafer in the knot chamber (i.e., is that wafer going into the loop or out of the loop).

A "cyclic shift" of wafers in the processing loop is a sequence of wafer exchanges such that a wafer in succ(X) is replaced by a wafer from X. Since the predecessor chamber is unique for all but the knot chamber, the cyclic shift is possible only if the wafer in the knot chamber is entering the loop while being moved (shifted) into its target chamber. While a starting chamber for the cyclic shift can be any chamber in the loop, to maximize the throughput, a priority should be given to those starting points which minimize the total robot waiting time in the cycle (i.e., starting points which minimize the sum of times robot spends at each of the chambers in the loop waiting for the wafer inside to be processed).

Unless there are empty chambers in the loop, a dual-blade robot must perform a full cycle shift in order to start and end the sequence of wafer exchanges with both blades empty. Thus, to use a dual-blade robot in deadlock resolution, the following rules are followed:

a) If a wafer in the knot chamber is directed into the loop, the robot's primary move should be a cyclic shift of wafers in the loop. If possible, prior to this highest priority move, the robot may perform wafer exchanges outside the loop which are either upstream or downstream of the knot chamber but do not involve the knot chamber.

b) If a wafer in the knot chamber is directed out of the loop, a DBR should perform wafer exchanges which are outside the loop and which involve the knot chamber. The primary move here should be replacing the wafer in the knot chamber with a wafer from its predecessor chamber outside the loop. If wafer in the knot chamber or wafer in the predecessor chamber is not ready to move, a robot may do a "meanwhile" move outside the loop (downstream or upstream of these two chambers). Such a move is described below.

c) When performing a cyclic shift, a robot should start the sequence of wafer swaps with a highest priority chamber (i.e., the chamber which minimizes the total robot waiting time in the loop).

Based on the above discussion and derived rules(a),(b) and (c), the best possible approach here is to apply gamma-tolerant scheduling conditioned on the direction of the wafer in the knot chamber. Gamma-tolerant scheduling for a single-blade robot is described in commonly assigned U.S. patent application Ser. No. 08/735,370 filed Oct. 21, 1996 now U.S. Pat. No. 5,928,389, issued Jul. 17, 1999 and for a dual blade robot in commonly assigned U.S. patent application Ser. No. 09/015,726 filed Jan. 29, 1998 now U.S. Pat. No. 6,074,443, issued Jun. 13, 2000. Both of these applications are herein incorporated by reference. Using gamma-tolerant scheduling to enhance the deadlock resolution routine is summarily represented as follows:

1. If the wafer in the knot chamber is leaving the processing loop, go to Step 2. Else (wafer in the knot chamber is going into the loop), go to Step 3.

2. Perform gamma tolerant scheduling with primary move being introducing a new wafer into the knot chamber (i.e., into the processing loop). Thus, for the primary move, the robot would start with the highest priority chamber upstream of the knot chamber and do a sequence of wafer swaps which involve the knot chamber. The meanwhile move candidates are wafer exchanges outside the loop which do not involve the knot chamber. Go to Step 1.

3. Perform gamma tolerant scheduling with primary move being cyclic shift which starts with the highest priority chamber in the loop. The meanwhile move candidates are wafer exchanges outside the loop which do not involve the knot chamber. (In either case, the robot starts and ends the sequence of wafer swaps with both blades empty.) Go to Step 1.

To arrive at a complete description of the above routine, gamma-tolerant scheduling is imbedded into Steps 2 and 3 above. As explained in the above-referenced patent applications, a gamma-tolerant scheduling technique involves two types of decisions. A 'primary' decision (e.g., service the highest priority chamber) and a 'meanwhile' decision (e.g., rather than waiting to service the highest priority chamber, do a useful move elsewhere). A meanwhile move can be performed either according to the same or a different priority index.

Let $t_{1p}$ be the latest point in time a primary move (decision) could start. In other words, if the primary move starts after $t_{1p}$, the primary objective will be jeopardized. Let $t_{cur}$ be the current time and define the interval $$\Delta_{pr} := t_{1p} - t_{cur}.$$

The value $\Delta_{pr}$ is approximately the amount of time remaining to complete wafer processing in the knot chamber (or some other chamber designated as being involved in a primary move). If $\Delta_{pr} \leq 0$, the routine must perform the "primary" move (the move is already late). Else, if $\Delta_{pr} > 0$, there may be a chance to perform a "meanwhile" move before having to perform the primary move. Let $\Delta_{mw}$ be the time needed for the meanwhile move (or moves if there are several possibilities between two primary moves) to be performed and let $$\lambda = \frac{\Delta_{mw}}{\Delta_{pr}}.$$

If $\lambda < \gamma$, perform the meanwhile move; else, wait if necessary and perform the primary move. A positive number $\gamma$ is a system dependent threshold value. Clearly, if $\gamma \leq 1$, a meanwhile move is accomplished only if there is enough time for the move to be completed without being late for the primary move. If $\gamma > 1$, the meanwhile move is made even if it means being late in executing the primary move. The system will tolerate (even welcome) being late for the primary move provided a useful move is made elsewhere. Hence the name "γ-tolerant" scheduling. A complete intolerant scheduling routine is represented as pseudocode as follows:

1. Locate the highest priority chamber with wafer in it. Go to Step 2.

2. Calculate the latest instant to position the robot in front of the highest priority chamber found in Step 1. Let $t_{1p}$ be that instant and let $t_{cur}$ be the current time. Go to Step 3.

3. If $t_{1p} \leq t_{cur}$, go to Step 4. Else ($t_{1p} > t_{cur}$), go to Step 5.

4. Do the primary move (i.e., pick up a wafer from the highest priority chamber and do consecutive wafer exchanges until both blades are empty). Go to Step 1.

5. Calculate the time $\Delta$ for the meanwhile move(s) according to the same priority index. Go to Step 6.

6. If $(t_{1p} - t_{cur})^{-1} \Delta_{mw} < \gamma$, go to Step 4.

7. Do the meanwhile moves(s). Update the current time $t_{cur}$ and go to Step 3.

Note that the routine performs two calculations. First, in Step 2, it calculates the latest instant to position the robot in front of the highest priority chamber (which is found in Step 1). This latest instant $t_{1p}$ depends not only on the state of the wafer in the highest priority chamber but also on the state of the wafer in its successor chamber, the successor of its successor and so on. Second, in Step 5, the routine calculates the $\Delta_{mw}$ needed for the meanwhile move. Details of both calculations are given in commonly assigned U.S. patent application Ser. No. 08/735,370 filed Oct. 21, 1996 now U.S. Pat. No. 5,928,389, issued Jul. 17, 1999.

A complete deadlock resolution routine that couples the γ-tolerant scheduling technique with a deadlock resolution technique using a dual-blade robot is represented in pseudocode as follows:

1. If wafer in the knot chamber is leaving the processing loop, go to Step 2. Else (wafer in the knot chamber is entering processing loop), go to Step 3.

2. Locate the highest priority chamber upstream of the knot chamber with wafer in it. Go to Step 4.

3. Locate the highest priority chamber in the processing loop with wafer in it. Go to Step 4.

4. Calculate the latest instant to position the robot in front of the highest priority chamber. Let $t_{1p}$ be that instant and let $t_{cur}$ be the current time. Go to Step 5.

5. If $t_{1p} \leq t_{cur}$, go to Step 6. Else ($t_{1p} > t_{cur}$), go to Step 7.

6. Do the primary move. (Depending on the outcome in Step 1, robot will either pick up a wafer from the highest priority chamber outside the loop and do consecutive wafer exchanges until both blades are empty or it will do the cyclic shift (again starting with the highest priority chamber) until both blades are empty. Go to Step 1.

7. Calculate the time $\Delta_{mw}$ for the meanwhile move(s) according the same priority index. Go to Step 7.

8. If $(t_{1p}-t_{cur})^{-1}\Delta_{mw}<\gamma$, go to Step 9. Else, go to Step 6.

9. Do the meanwhile move. (In either case, the robot performs wafer exchanges outside the loop which do not involve the knot chamber. The robot starts and ends the sequence of wafer swaps with both blades empty.) Update the current $t_{cur}$ and go to Step 5.

The primary move in Step 6 depends on the direction of the wafer in the knot chamber. It is either outside the loop or it a cyclic shift of wafers inside the loop. In either case, it involves the knot chamber. The meanwhile move in Step 9 is servicing a sequence of chambers according to general rules of priority scheduling for dual blade robots. It is applied to chambers outside the loop and never involves the knot chamber.

Figure 9:
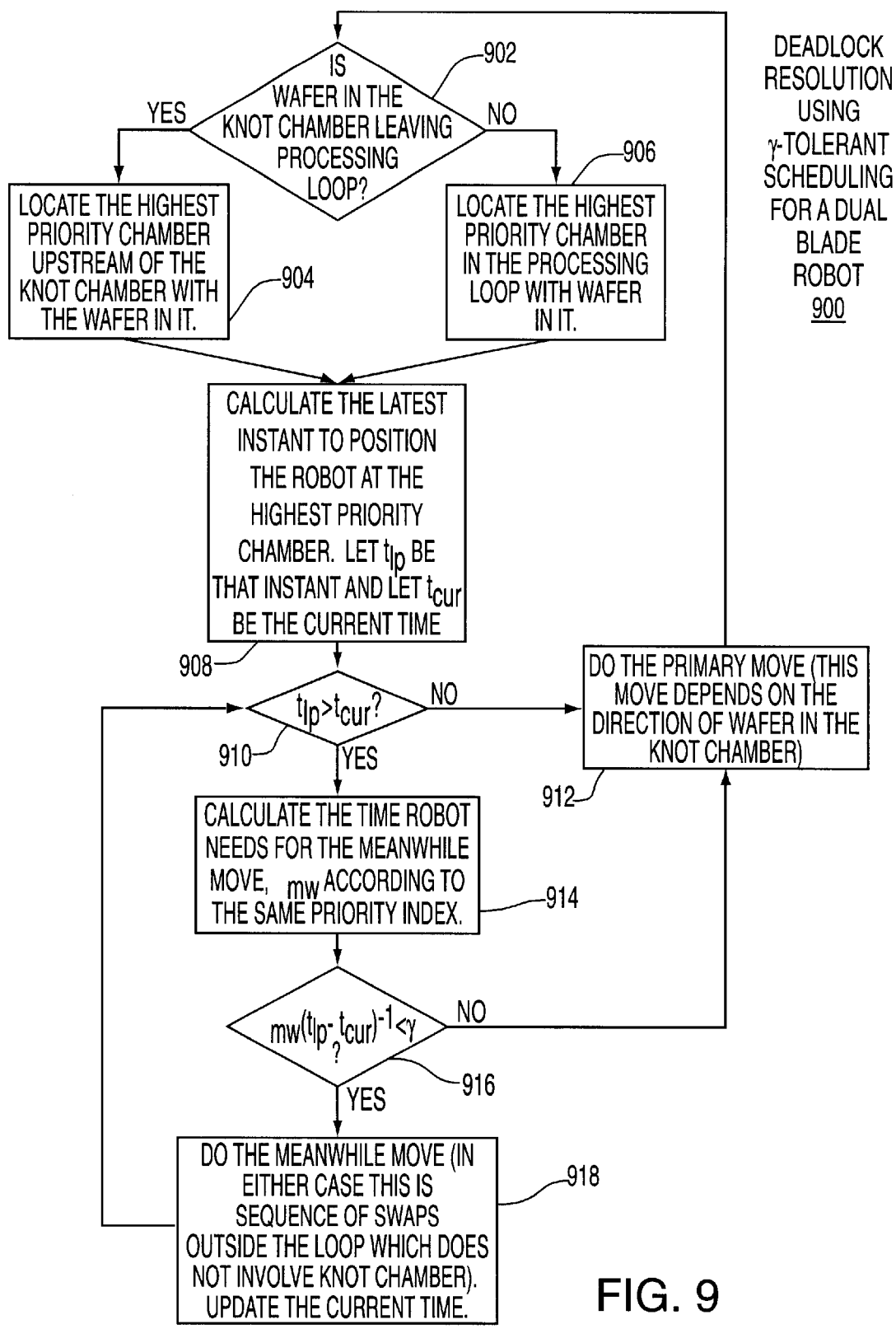
FIG. 9 depicts a flow diagram of a complete deadlock resolution routine for a dual-blade robot.

FIG. 9 depicts a flow diagram of a complete deadlock resolution routine 900 based upon γ-tolerant scheduling using a dual-blade robot. The routine 900 begins at step 902 where the routine queries whether the wafer that is located in the knot chamber is leaving the loop. If the query is affirmatively answered, the routine proceeds to step 904, where the highest priority upstream chamber is identified that presently contains a wafer. If the query is negatively answered, the routine proceeds to step 906 where the routine locates the highest priority chamber in the processing loop that contains a wafer. After either step 904 or 906, the routine proceeds to step 908.

At step 908, the routine computes the latest instant to position the robot at the highest priority chamber, where $t_{1p}$ is that instant and to is the current time. At step 910, the routine queries whether $t_{1p}>t_{cur}$. If the query is negatively answered, the routine proceeds to step 912, where the primary move is performed. The primary move will either pick up a wafer from the highest priority chamber outside the loop and perform consecutive wafer exchanges until both blades are empty or the primary move will accomplish the cyclic shift (again starting with the highest priority chamber) until both blades are empty. If the query at step 910 is affirmatively answered, the routine calculates the time $\Delta_{mw}$ for the meanwhile move(s) according to the same priority index.

At step 916, the routine queries whether the $(t_{1p}-t_{cur})^{-1}\Delta_{mw}<\gamma$. If the query is negatively answered, the routine performs the primary move at step 912. Otherwise, the routine proceeds to step 918 where it performs the meanwhile move such that the robot accomplishes wafer exchanges outside the loop which do not involve the knot chamber. The robot starts and ends the sequence of wafer swaps with both blades empty.) Lastly, the routine updates the current $t_{cur}$ and returns to step 910.

Using the combined deadlock resolution technique and the γ-tolerant scheduling technique provides a substantial improvement in throughput by allowing other wafer exchanges to be accomplished while the robot is waiting to accomplish a primary move as well as prioritizing the exchanges to resolve deadlocks with a high priority.

E. Throughput Analysis of a Two-Chamber Circular Wait

To demonstrate the throughput improvements produced by the present invention, a two chamber cluster tool is analyzed.

To quantify the loss of throughput due to deadlock handling mechanisms in 2-chamber cluster tools with wafer flow $LL \to C_1 \to C_2 \to C_1 \to LL$, the values of chamber processing times as well as values of robot parameters (e.g., rotation, extension, and retraction times with and without a wafer on the blade) need to be known.

The (wafer) processing time in chamber $C_j$, denoted by $T_j$, is the time interval from the instant a slit-valve of $C_j$ is closed until the instant a wafer is ready to leave the chamber. ($T_j$ is the sum of pre-process, process, and post-process time.) The knot-chamber $C_1$ has two values of processing time associated with it. These are $T_1'$ and $T_1''$, for the wafers described by transitions $LL \to C_1$ and $C_2 \to C_1$, respectively. That is, $T_1'$ and $T_1''$ are the values of processing time in chamber $C_1$ for the first and second visit of the same wafer.

A wafer exchange time for chamber $C_j$, denoted by $e_j$, is the time necessary to move a wafer $W_a$ from $C_j$ into the next chamber in the processing sequence and to move some other wafer $W_b$ from the previous chamber in the processing sequence into $C_j$.

The first consideration is deadlock avoidance by deadline scheduling. The analysis here is simple since there can be at most one wafer in the cluster tool (excluding load locks) at any time. A wafer to be processed is simply taken from load lock then moved to $C_1$ then to $C_2$ and then back to $C_1$, respectively, and then returned to loadlock. The throughput here is given by $$S_{DA} = \frac{1}{c + T_1' + T_1'' + T_2}$$

where c is a robot-related constant (a linear combination of rotation, extension and retraction times). If, in order to improve the throughput, the processing loop is removed by installing an additional chamber $C_3$, the wafer flow becomes $LL \to C_1 \to C_2 \to C_3 \to LL$. For pure serial traces the throughput under a "wafer packing routine" is maximum and is given by $$S_{wp} = \frac{1}{\max(c + r, T_1 + e_1, T_2 + e_2 T_1 + e_3)}$$

where r is a two-full-circle robot rotation time while $e_1$, $e_2$ and $e_3$ are wafer exchange times. It is easy to see that for very short processing times it is possible to have $S_{DA}>S_{WP}$. As the processing times increase, the value of $S_{WP}$ becomes larger. In fact, for all processing times of practical interest, the effect of deadline scheduling on throughput of a 2-chamber cluster tool is devastating.

Figure 10A:
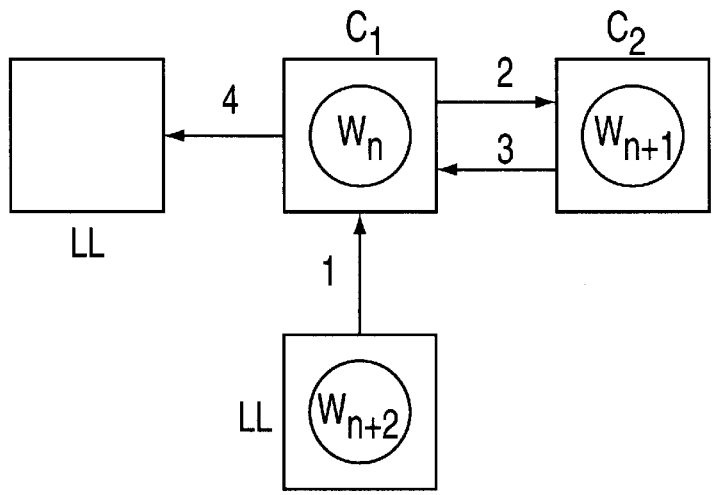
FIG. 10A depicts flow diagram of a 2-chamber circular wait.

Next, chamber preemption by a dual-blade robot is considered. Depicted in FIG. 10A is a wafer flow scenario when wafer $W_n$, is about to leave the knot-chamber $C_1$ for the second time (after being processed for $T_1''$ seconds). As $W_n$ leaves, there may be a chamber contention since wafer $W_{n+1}$ from $C_2$ as well as wafer $W_{n+2}$ from the load lock may have requested the allocation of $C_1$ during the time interval of $T_1''$ seconds. If $C_1$ is always allocated to a wafer from $C_2$ (e.g. to $W_{n+1}$), there will be only one wafer in the cluster tool at any time and deadlock will never take place. However, for all processing times of practical interest, the throughput is maximized by the "feed-first" rule which in this case says that $C_1$ should be allocated to $W_{n+2}$ (after $W_n$ leaves the knot-chamber $C_1$). Once both $W_{n+1}$ and $W_{n+2}$ are finished, they will be swapped by a dual-blade robot so that $W_{n+1}$ gets into $C_1$ (for the second time) and $W_{n+2}$ goes into $C_2$.

Figure 10B:
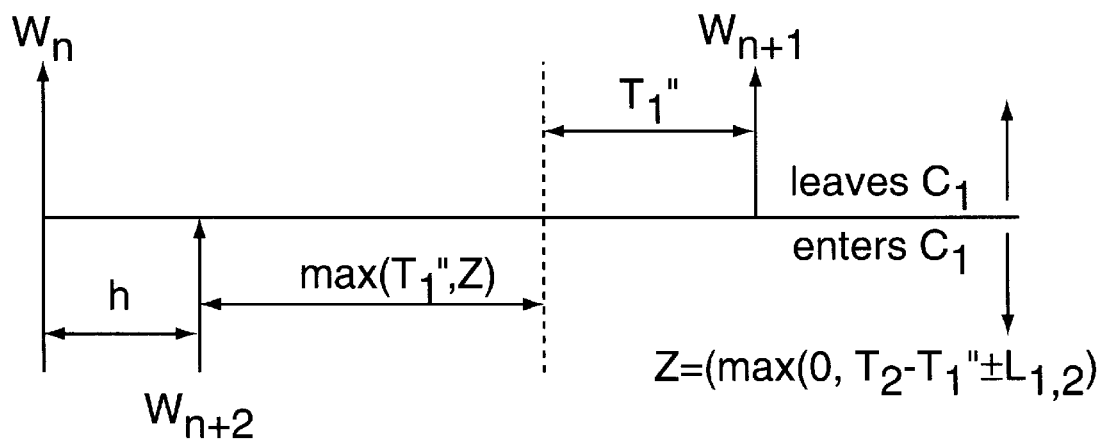
FIG. 10B depicts a timing diagram representing chamber preemption by dual blade robot for the 2-chamber circular wait of FIG. 10A.

Depicted in FIG. 10B is the timing diagram corresponding to the scenario of FIG. 10 starting with the instant when wafer $W_n$ is about to leave the knot-chamber $C_1$. After the wafer exchange time h, wafer $W_{n+2}$ is in $C_1$. The time interval h is the sum of times necessary for a dual-blade robot to move wafer $W_n$ from $C_1$, into the load lock and to move wafer $W_{n+2}$ from load lock into $C_1$. Once $W_{n+2}$ is in $C_1$, both wafers are finished processing after the time $\max(T_1',\max(0,T_2-T_1''\pm l_{1,2}))$, where $l_{1,2}$ is the time a dual-blade robot needs to rotate from home position at $C_1$ to home position at $C_2$ with a wafer on its blade. The ± sign above is either a + or a − depending on which chamber is the starting point in swapping wafers in $C_1$ and $C_2$. After approximately $T_1''$ seconds from the instant of swapping $W_n$ and $W_{n-1}$, the wafer $W_{n+1}$ will be about to leave the knot-chamber $C_1$ and the cycle is over. The result is $$S_{FF} = \frac{1}{h + T_1'' + \max(T_1', \max(0, T_2 - T_1'' \pm l_{1,2}))}$$

where subscript "FF" stands for "feed-first". By trying cases $T_2 > T_1''$ and $T_2 < T_1' + T_1''$, the above expression for throughput is simplified to $$S_{FF} \approx \frac{1}{h + \max(T_2, T_1)}$$

where $T_1 \equiv T_1' + T_1''$ is the total processing time in the knot chamber and ≈ (approximation) sign above comes from neglecting the term $\pm l_{1,2}$. As anticipated, with respect to throughput, chamber preemption by a dual-blade robot is a better alternative than deadline scheduling regardless of the values of processing times $T_1'$, $T_2$ and $T_1''$. In fact, if $T_2 > T_1' + T_1''$, chamber preemption is the best possible alternative (it is better than the loop-free, 3-chamber reference tool with the wafer flow LL→$C_1$→$C_2$→$C_3$→LL).

Finally, if rather than using a dual-blade robot, a single-blade robot is used and wafers in $C_1$ and $C_2$ are swapped by (temporarily) placing one of the deadlocked wafers elsewhere, the analysis is almost identical. The only difference is in the wafer transfer times and in the time necessary to do the wafer swapping (obviously, this time is now larger). If PB is the temporary wafer holder (penalty box), we would have either $C_1$→PB, $C_2$→$C_1$, PB→$C_2$ wafer transfers, or $C_2$→PB, $C_1$→$C_2$, PB→$C_1$ wafer transfers. The trade-off here is a dual-blade robot and somewhat higher throughput vs. single-blade robot and temporary wafer holder (e.g. a place in the cassette that belongs to the victim wafer).

Although various embodiments which incorporate the teachings of the present invention have been shown and described in detail herein, those skilled in the art can readily devise many other varied embodiments that still incorporate these teachings.

What is claimed is:

1. A method for handling deadlocks in a semiconductor wafer processing system having multiple process chambers comprising the steps of:
    (a) receiving a request to allocate a chamber to facilitate a move of a wafer from a requesting chamber to a knot chamber, wherein the knot chamber is a chamber that is used at least twice within a processing loop that contains a plurality of chambers;
    (b) determining a number of wafers being processed within the processing loop;
    (c) comparing the number of wafers being processed within the processing loop to a maximum number of wafers that can be processed within the processing loop;
    (d) if the number of wafers being processed within the processing loop is less than the maximum number of wafers that can be processed within the processing loop, then allocating the knot chamber to the requesting chamber;
    (e) otherwise, if the number of wafers being processed within the processing loop is at least the maximum number of wafers that can be processed within the processing loop, then denying the request.

2. The method of claim 1 further comprising the steps of:
   if said request is denied, waiting a predefined period of time, then repeating steps (b), (c), (d), and (e).

3. The method of claim 1 further comprising the steps of:
   identifying the requesting chamber as being a chamber within a processing loop or outside the processing loop; and
   prioritizing wafer movement to the knot chamber depending upon whether the requesting chamber is outside the processing loop or inside the processing loop.

4. A method for detecting a deadlock condition within a semiconductor wafer processing system having a plurality of process chambers comprising the steps of:
    (a) determining a first chamber having completed processing;
    (b) determining if a processing loop exists for a wafer in said first chamber; and
    (c) determining if a circular wait exists in said processing loop and, if a circular wait is found, indicating that a deadlock condition exists.

5. The method of claim 4 wherein steps (b) and (c) further comprise the steps of:
    (b1) searching a schedule for a wafer in said chamber for an available successor chamber to fulfill a next processing step in the schedule;
    (b2) if an available successor chamber is found, indicating that no deadlock exists;
    (b3) if no available successor chamber is found, determining if a successor chamber that is unavailable is the first chamber, then indicating that a deadlock exists;
    (b4) otherwise, if the successor chamber that is unavailable is other than the first chamber, then incrementing a successor chamber identifier by one, where the successor chamber is the first chamber and repeating steps (b1), (b2), (b3), and (b4) until all the chambers in a schedule for the wafer in the first chamber of step (a) have been processed to identify a circular wait.

6. The method of claim 5 wherein step (b3) further comprises the steps of:
    (b3')returning to a scheduling routine a list of all wafers involved in the circular wait and a list of all chambers containing wafers in the circular wait that have completed processing.

7. The method of claim 6 further comprising the step of:
    (d) removing a victim wafer from a chamber that is identified in step (b3') as having completed processing; and
    (e) placing the victim wafer in a temporary storage location to resolve the deadlock.

8. The method of claim 7 wherein step (d) removes a plurality of victim wafers.

9. The method of claim 7 wherein step (d) further comprises the steps of:
    (d1) prioritizing the wafers that are identified as being in the processing loop; and (d2) removing wafers from the processing loop as victim wafers in accordance with the prioritization of each wafer.

10. The method of claim 4 further comprising the step of
(d) identifying a knot chamber within a processing loop having a deadlock, where the knot chamber is a chamber that is used at least twice within a processing loop that contains the plurality of process chambers.

11. The method of claim 10 wherein step (d) further comprises the steps of:
(d1) removing a victim wafer from the knot chamber; and
(d2) placing the victim wafer in a temporary storage location to resolve the deadlock.

12. The method of claim 11 wherein step (d1) removes a plurality of victim wafers.

13. The met hod of claim 11 wherein step (d1) further comprises the steps of:
(d1') prioritizing the wafers that are identified as being in the processing loop; and
(d2') removing wafers from the processing loop as victim wafers in accordance with the prioritization of each wafer.

14. The method of claim 13 wherein the wafers are prioritized in accordance with gamma-tolerant prioritization.

15. The method of claim 14 wherein gamma-tolerant prioritization comprises the steps of:
identifying a wafer in the knot chamber, where moving the wafer into the knot chamber is designated a primary move;
computing a latest time instant ($t_{1p}$) a robot can be positioned at a highest priority chamber and be able to complete a wafer movement from the highest priority chamber without the highest priority chamber waiting for service for more than a predefined period;
computing a meanwhile time period within which the robot can perform another move, a meanwhile move, prior to the latest time instant; and
if the meanwhile time period does not exceed the latest time instant, performing the meanwhile move; otherwise, performing the primary move.

16. The method of claim 15 wherein the primary move is any wafer move that involves the knot chamber, and a meanwhile move is any wafer move that does not involve the knot chamber.

17. The method of claim 16 wherein the wafers involved in a primary move are prioritized, and wafers involved in a meanwhile move are prioritized, wherein the wafers are moved in a sequence according to the wafer prioritization.

18. The method of claim 17 wherein the primary move is any wafer move that involves the knot chamber, and a meanwhile move is any wafer move that does not involve the knot chamber.

19. The method of claim 14 wherein gamma-tolerant prioritization comprises the steps of:
identifying a wafer in the knot chamber, where moving the wafer in the knot chamber is designated a primary move;
determining a time to complete ($\Delta_{pr}$) processing for the knot chamber;
computing a time to perform ($\Delta_{mw}$) a wafer move for at least one other chamber;
dividing ($\Delta_{mw}$) by ($\Delta_{pr}$) to produce a quotient;
comparing the quotient to a threshold value;
if the quotient is less than the threshold value, then performing the primary move; and
if the quotient is greater than the threshold value, then performing the meanwhile move.

20. In a system for controlling the process sequence of wafers through a cluster tool containing a plurality of chambers, a general purpose computer system that operates as a special purpose controller when executing a program stored in a computer readable medium to perform a process comprising the steps of:
(a) receiving a request to allocate a chamber to facilitate a move of a wafer from a requesting chamber to a knot chamber, where the knot chamber is a chamber that is used at least twice within a processing loop that contains a plurality of chambers;
(b) determining a number of wafers being processed within the processing loop;
(c) comparing the number of wafers being processed within the processing loop is less than the maximum number of wafers that can be processed within the processing loop, then allocating the knot chamber to the requesting chamber;
(d) otherwise, if the number of wafers being processed within the processing loop is at least the maximum number of wafers that can be processed within the processing loop, then denying the request.

21. The process of claim 20 further comprising the steps of:
if said request is denied, waiting a predefined period of time, then repeating steps (b), (c), (d), and (e).

22. The process of claim 20 further comprising the steps of:
identifying the requesting chamber as being a chamber within a processing loop or outside the processing loop; and
prioritizing wafer movement to the knot chamber depending upon whether the requesting chamber is outside the processing loop or inside the processing loop.

23. In a system for controlling the process sequence of wafers through a cluster tool containing a plurality of chambers, a general purpose computer system that operates as a special purpose controller when executing a program stored in a computer readable medium to perform a process comprising the steps of:
(a) determining a first chamber having completed processing;
(b) determining if a processing loop exists for a wafer in said first chamber; and
(c) determining if a circular wait exists in said processing loop and, if a circular wait is found, indicating that a deadlock condition exists.

24. The process of claim 23 wherein steps (b) and (c) further comprise the steps of:
(b1) searching a schedule for a wafer in said chamber for an available successor chamber to fulfill a next processing step in the schedule;
(b2) if an available successor chamber is found, indicating that no deadlock exists;
(b3) if no available successor chamber is found, determining if a successor chamber that is unavailable is the first chamber, then indicating that a deadlock exists;
(b4) otherwise, if the successor chamber that is unavailable is other than the first chamber, then incrementing a successor chamber identifier by one, where the successor chamber is the first chamber and repeating steps (b1), (b2), (b3), and (b4) until all the chambers in a schedule for the wafer in the first chamber of step (a) have been processed to identify a circular wait.

25. The process of claim 24 wherein step (b3) further comprises the steps of:
   (b3') returning to a scheduling routine a list of all wafers involved in the circular wait and a list of all chambers containing wafers in the circular wait that have completed processing.

26. The process of claim 25 further comprising the step of:
   (d) removing a victim wafer from a chamber that is identified in step (b3') as having completed processing; and
   (e) placing the victim wafer in a temporary storage location to resolve the deadlock.

27. The process of claim 26 wherein step (d) removes a plurality of victim wafers.

28. The process of claim 26 wherein step (d) further comprises the steps of:
   (d1) prioritizing the wafers that are identified as being in the processing loop; and
   (d2) removing wafers from the processing loop as victim wafers in accordance with the prioritization of each wafer. move is any wafer move that does not involve the knot chamber.

29. The process of claim 25 further comprising the step of (d) identifying a knot chamber within a processing loop having a deadlock, where the knot chamber is a chamber that is used at least twice within a processing loop that contains the plurality of process chambers.

30. The process of claim 29 wherein step (d) further comprises the steps of:
   (d1) removing a victim wafer from the knot chamber; and
   (d2) placing the victim wafer in a temporary storage location to resolve the deadlock.

31. The process of claim 30 wherein step (d1) removes a plurality of victim wafers.

32. The process of claim 30 wherein step (d1) further comprises the steps of:
   (d1') prioritizing the wafers that are identified as being in the processing loop; and
   (d2') removing wafers from the processing loop as victim wafers in accordance with the prioritization of each wafer.

33. The process of claim 32 wherein the wafers are prioritized in accordance with gamma-tolerant prioritization.

34. The process of claim 33 wherein gamma-tolerant prioritization comprises the steps of:
   identifying a wafer in the knot chamber, where moving the wafer in the knot chamber is designated a primary move; computing a latest time instant ($t_{1p}$) a robot can be positioned at a highest priority chamber and be able to complete a wafer movement from the highest priority chamber without the highest priority chamber waiting for service for more than a predefined period;
   computing a meanwhile time period within which the robot can perform another move, a meanwhile move, prior to the latest time instant; and
   if the meanwhile time period does not exceed the latest time instant, performing the meanwhile move;
   otherwise, performing the primary move.

35. The process of claim 34 wherein the primary move is any wafer move that involves the knot chamber, and a meanwhile move is any wafer move that does not involve the knot chamber.

36. The process of claim 34 wherein the wafers involved in a primary move are prioritized, and wafers involved in a meanwhile move are prioritized, where the wafers are moved in a sequence according to the wafer prioritization.

37. The process of claim 33 wherein gamma-tolerant prioritization comprises the steps of:
   identifying a wafer in the knot chamber, where moving the wafer in the knot chamber is designated a primary move;
   determining a time to complete ($\Delta_{pr}$) processing for the knot chamber;
   computing a time to perform ($\Delta_{mw}$) a wafer move for at least one other chamber;
   dividing ($\Delta_{mw}$) by ($\Delta_{pr}$) to produce a quotient;
   comparing the quotient to a threshold value;
   if the quotient is less than the threshold value, then performing the primary move; and
   if the quotient is greater than the threshold value, then performing the meanwhile move.

38. The process of claim 37 wherein the primary move is any wafer move that involves the knot chamber, and a meanwhile move is any wafer move that does not involve the knot chamber.

39. The process of claim 38 wherein the wafers involved in a primary move are prioritized, and wafers involved in a meanwhile move are prioritized, where the wafers are moved in a sequence according to the wafer prioritization.

* * * * *

UNITED STATES PATENT AND TRADEMARK OFFICE
CERTIFICATE OF CORRECTION

PATENT NO.    : 6,336,204 B1
DATED         : January 1, 2002
INVENTOR(S)   : Jevtic It is certified that error appears in the above-identified patent and that said Letters Patent is hereby corrected as shown below:

Column 5,
Line 11, please replace " parallels" with -- parallel --.

Column 9,
Line 37, please replace "$LL_{1pullout;zu844300.9002}$" with -- $LL_{1v2}$ --.
Line 38, please replace "$LL_{1pullout;zu844300.9002}$" with -- $LL_{1v2}$ --.
Line 63, please replace "•" with -- ••• --.

Column 10,
Line 59, please replace "D(t)" with -- L(t) --.

Column 11,
Line 11, please replace "is a not" with -- is not --.
Line 47, please replace "he" with -- the --.

Column 16,
Line 16, please delete "15".

Column 18,
Line 22, please replace "intolerant" with -- γ-tolerant --
Line 33, please replace "$\Delta$" with -- $\Delta_{mw}$ --.

Column 19,
Line 33, please replace "to" with -- $t_{cur}$ --.

Column 20,
Line 66, please replace "10" with -- 10A --.

Column 21,
Line 11, please replace "$W_{n-1}$" with -- $W_{n+1'}$ --.

Column 23,
Line 16, please replace "met hod" with -- method --.

UNITED STATES PATENT AND TRADEMARK OFFICE
CERTIFICATE OF CORRECTION

PATENT NO. : 6,336,204 B1
DATED : January 1, 2002
INVENTOR(S) : Jevtic

It is certified that error appears in the above-identified patent and that said Letters Patent is hereby corrected as shown below:

Column 23,
Lines 26-41, please replace the existing Claim 15 with the following:
-- 15. The method of claim 14 wherein gamma-tolerant prioritization comprises the steps of:
    identifying a wafer in the knot chamber, where moving the wafer into the knot chamber is designated a primary move;
    computing a latest time instant ($t_{1p}$) a robot can be positioned at a highest priority chamber and be able to complete a wafer movement from the highest priority chamber without the highest priority chamber waiting for service for more than a predefined period;
    computing a meanwhile time period within which the robot can perform another move, a meanwhile move, prior to the latest time instant;
    if the current time plus the meanwhile time period does not exceed the latest time instant, performing the meanwhile move;
    otherwise, performing the primary move. --

Column 24,
Lines 3-24, please replace the existing Claim 20 with the following:
-- 20. In a system for controlling the process sequence of wafers through a cluster tool containing a plurality of chambers, a general purpose computer system that operates as a special purpose controller when executing a program stored in a computer readable medium to perform a process comprising the steps of:
    (a) receiving a request to allocate a chamber to facilitate a move of a wafer from a requesting chamber to a knot chamber, where the knot chamber is a chamber that is used at least twice within a processing loop that contains a plurality of chambers;
    (b) determining a number of wafers being processed within the processing loop;
    (c) comparing the number of wafers being processed within the processing loop to a maximum number of wafers that can be processed within the processing loop;
    (d) if the number of wafers being processed within the processing loop is less than the maximum number of wafers that can be processed within the processing loop, then allocating the knot chamber to the requesting chamber;
    (e) otherwise, if the number of wafers being processed within the processing loop is at least the maximum number of wafers that can be processed within the processing loop, then denying the request. --

UNITED STATES PATENT AND TRADEMARK OFFICE
CERTIFICATE OF CORRECTION

PATENT NO. : 6,336,204 B1
DATED : January 1, 2002
INVENTOR(S) : Jevtic

It is certified that error appears in the above-identified patent and that said Letters Patent is hereby corrected as shown below:

Column 25,
Lines 22-23, please delete the phrase, "move is any wafer move that does not involve the knot chamber."

Signed and Sealed this

Sixteenth Day of July, 2002

*Attest:*

*Attesting Officer*

JAMES E. ROGAN
*Director of the United States Patent and Trademark Office*